US012580026B2

(12) United States Patent
Suzuki et al.

(10) Patent No.: US 12,580,026 B2
(45) Date of Patent: *Mar. 17, 2026

(54) SEMICONDUCTOR DEVICE

(71) Applicant: Kioxia Corporation, Tokyo (JP)

(72) Inventors: Yoshinao Suzuki, Yokohama Kanagawa (JP); Kazuto Shitara, Kamakura Kanagawa (JP); Kenta Shibasaki, Kamakura Kanagawa (JP); Noriyasu Kumazaki, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 157 days.

This patent is subject to a terminal disclaimer.

(21) Appl. No.: 18/408,680

(22) Filed: Jan. 10, 2024

(65) Prior Publication Data

US 2024/0233835 A1　　Jul. 11, 2024

(30) Foreign Application Priority Data

Jan. 10, 2023　(JP) ................................ 2023-001968

(51) Int. Cl.
| *G11C 16/30* | (2006.01) |
| *G11C 16/04* | (2006.01) |
| *H02M 3/07* | (2006.01) |
| *G11C 16/10* | (2006.01) |
| *G11C 16/26* | (2006.01) |

(52) U.S. Cl.
CPC .......... *G11C 16/30* (2013.01); *G11C 16/0483* (2013.01); *H02M 3/07* (2013.01); *G11C 16/10* (2013.01); *G11C 16/26* (2013.01)

(58) Field of Classification Search
CPC .......... G11C 16/30; G11C 16/28; G11C 16/04
See application file for complete search history.

(56) References Cited

U.S. PATENT DOCUMENTS

| | | | |
|---|---|---|---|
| 9,898,403 | B2 | 2/2018 | Tanaka et al. |
| 10,096,367 | B2 | 10/2018 | Tanikawa |
| 2012/0275226 | A1* | 11/2012 | Nakamura ............. G11C 16/30 |
| | | | 365/185.21 |
| 2013/0336067 | A1 | 12/2013 | Tanaka et al. |
| 2017/0076800 | A1 | 3/2017 | Musha |
| 2018/0102175 | A1 | 4/2018 | Tanikawa |

* cited by examiner

*Primary Examiner* — Jason Lappas
(74) *Attorney, Agent, or Firm* — Kim & Stewart LLP

(57) ABSTRACT

A semiconductor device includes a regulator circuit, a charge pump circuit, and a control circuit. The regulator circuit is configured to regulate a voltage input from outside and output a regulated voltage. The charge pump circuit is configured to receive the regulated voltage as an input voltage, boost the input voltage, and output a boosted voltage. The control circuit is configured to cause the regulator circuit to vary a voltage level of the regulated voltage based on voltage value information about the voltage input from the outside.

21 Claims, 19 Drawing Sheets

/RBn

DQx

80h

Address

Din Din Din Din Din

Data

10h t31    t program    t32

SEMICONDUCTOR DEVICE

CROSS-REFERENCE TO RELATED APPLICATION

This application is based upon and claims the benefit of priority from Japanese Patent Application No. 2023-001968, filed Jan. 10, 2023, the entire contents of which are incorporated herein by reference.

FIELD

Embodiments described herein relate generally to a semiconductor device.

BACKGROUND

As a type of semiconductor devices, a nonvolatile memory including a booster circuit is known. When the nonvolatile memory is driven, a power supply voltage is input to the booster circuit from the outside. In general, in a specification, a data sheet, or the like, a range of a voltage value of the power supply voltage at which the nonvolatile memory can normally operates is determined.

BRIEF DESCRIPTION OF THE DRAWINGS

FIG. 2 is a block diagram illustrating a configuration example of a nonvolatile memory according to the first embodiment;

FIG. 4 is a diagram illustrating an example of a configuration of a sequencer and a booster circuit in the nonvolatile memory according to the first embodiment;

FIG. 8 is a diagram illustrating an example of a configuration of a sequencer and a booster circuit in a nonvolatile memory according to a second embodiment;

FIG. 11 is a command sequence and a timing chart illustrating a write operation;

FIG. 16 is a diagram illustrating an example of a configuration of a sequencer and a booster circuit in a nonvolatile memory according to a third embodiment;

FIG. 17 is a diagram illustrating an example of a configuration of a sequencer and a booster circuit in a nonvolatile memory according to a modification of the third embodiment;

FIG. 19 is a block diagram illustrating a configuration example of a nonvolatile memory according to a fourth embodiment.

DETAILED DESCRIPTION

Embodiments provide a semiconductor device capable of improving power efficiency of a booster circuit.

In general, according to an embodiment, a semiconductor device includes a regulator circuit, a charge pump circuit, and a control circuit. The regulator circuit is configured to regulate a voltage input from outside and output a regulated voltage. The charge pump circuit is configured to receive the regulated voltage as an input voltage, boost the input voltage, and output a boosted voltage. The control circuit is configured to cause the regulator circuit to vary a voltage level of the regulated voltage based on voltage value information about the voltage input from the outside.

Hereinafter, embodiments will be described with reference to the drawings.

First Embodiment 1-1. Configuration of Memory System

Figure 1:
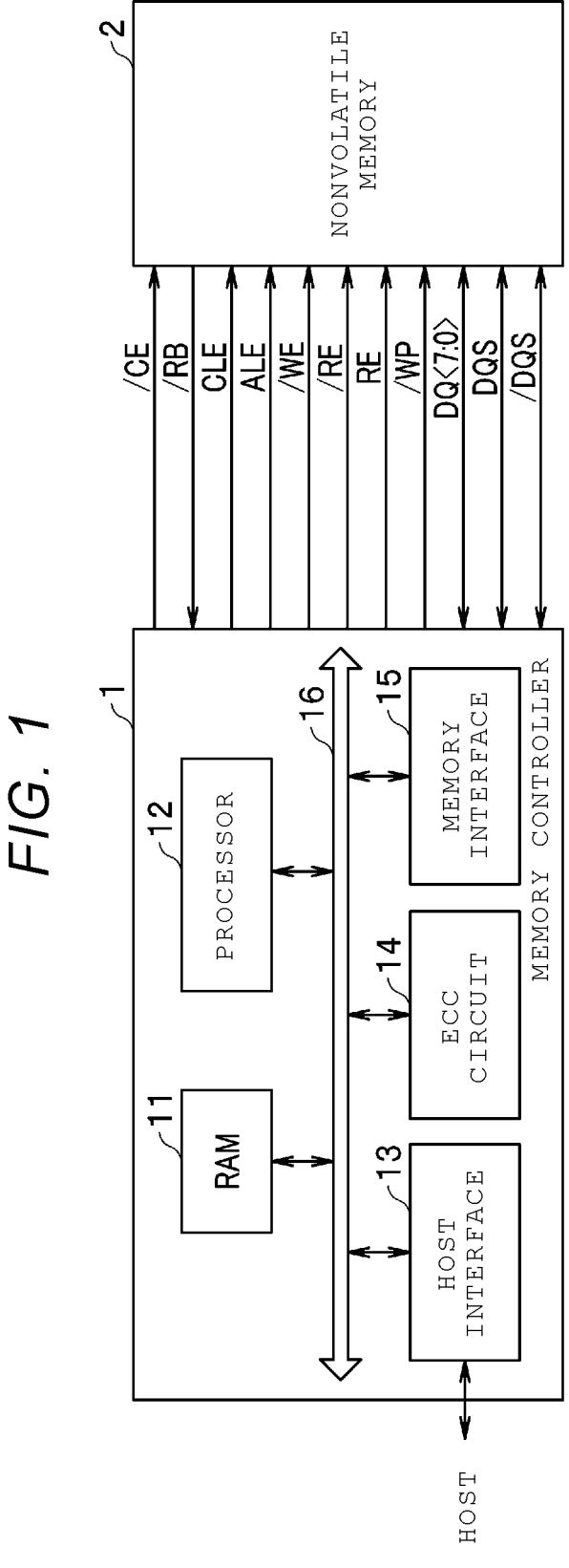
FIG. 1 is a block diagram illustrating a configuration example of a memory system according to a first embodiment.

FIG. 1 is a block diagram illustrating a configuration example of a memory system according to a first embodiment. The memory system according to the first embodiment includes a memory controller 1 and a nonvolatile memory 2 serving as a semiconductor memory device. The memory system can be connected to a host. The host is, for example, an electronic device such as a personal computer or a portable terminal.

The nonvolatile memory 2 is a memory device that stores data in a nonvolatile manner and includes, for example, a NAND memory (NAND flash memory). The nonvolatile memory 2 is, for example, a NAND memory that has a memory cell capable of storing 3 bits per memory cell, that is, a NAND memory of 3 bits/cell (TLC: Triple Level Cell). The nonvolatile memory 2 may be a NAND memory capable of storing a plurality of bits such as 1 bit/cell, 2 bits/cell, 4 bits/cell, or more. The nonvolatile memory 2 typically includes a plurality of memory chips.

The memory controller 1 controls writing of data in the nonvolatile memory 2 in response to a write request from the host. The memory controller 1 controls reading of data from the nonvolatile memory 2 in response to a read request from the host. Each signal such as a chip enable signal /CE, a ready busy signal /RB, a command latch enable signal CLE, an address latch enable signal ALE, a write enable signal /WE, read enable signals RE and/RE, a write protection signal /WP, a signal DQ<7:0> which is data, and data strobe signals DQS and/DQS is transmitted and received between the memory controller 1 and the nonvolatile memory 2. "/" added to a signal name represents an active low.

For example, each of the nonvolatile memory 2 and the memory controller 1 is formed as a semiconductor chip (hereinafter simply referred to as a "chip").

The chip enable signal /CE is a signal for selecting and enabling a specified memory chip of the nonvolatile memory 2. The ready busy signal /RB is a signal indicating whether the nonvolatile memory 2 is in a ready state (a state in which a command from the outside can be received) or a busy state (a state in which a command from the outside cannot be received). The memory controller 1 can know a state of the nonvolatile memory 2 when the ready busy signal /RB is received. The command latch enable signal CLE is a signal indicating that a signal DQ<7:0> is a command. The command latch enable signal CLE enables the command transmitted as the signal DQ<7:0> to be latched in a command register in the selected memory chip of the nonvolatile memory 2. The address latch enable signal ALE is a signal indicating that the signal DQ<7:0> is an address. The address latch enable signal ALE enables the address transmitted as the signal DQ<7:0> to be latched in an address register in the selected memory chip of the nonvolatile memory 2. The write enable signal /WE is a signal for taking the received signals DQ<7:0> in the nonvolatile memory 2 and is asserted whenever a command, an address, and data are received by the memory controller 1. While the write enable signal /WE is in a "low (L)" level, the nonvolatile memory 2 is instructed to take the signals DQ<7:0>.

The read enable signals RE and/RE are signals used for the memory controller 1 to read data from the nonvolatile memory 2. For example, these signals are used to control an operation timing of the nonvolatile memory 2 when the signals DQ<7:0> are output. The write protection signal /WP is a signal for instructing the nonvolatile memory 2 to prohibit data writing and erasing.

The signals DQ<7:0> are data transmitted and received between the nonvolatile memory 2 and the memory controller 1 and includes a command, an address, and data. The data strobe signals DOS and/DQS are signals for controlling input and output timings of the signals DQ <7:0>.

The memory controller 1 includes a random access memory (RAM) 11, a processor 12, a host interface 13, an error check and correct (ECC) circuit 14, and a memory interface 15. The RAM 11, the processor 12, the host interface 13, the ECC circuit 14, and the memory interface 15 are connected to each other via an internal bus 16.

The host interface 13 outputs a request received from the host, user data (write data) or the like to the internal bus 16. The host interface 13 transmits user data read from the nonvolatile memory 2, a response from the processor 12, and the like to the host.

The memory interface 15 controls a process of writing the user data or the like in the nonvolatile memory 2 and a process of reading the user data or the like from the nonvolatile memory 2 based on an instruction from the processor 12.

The processor 12 comprehensively controls the memory controller 1. The processor 12 is, for example, a central processing unit (CPU), a micro processing unit (MPU), or the like. When a request is received from the host via the host interface 13, the processor 12 executes a control operation in response to the request. For example, the processor 12 instructs the memory interface 15 to write the user data and a parity in the nonvolatile memory 2 in response to the request from the host. The processor 12 instructs the memory interface 15 to read user data and a parity from the nonvolatile memory 2 in response to a request from the host.

The processor 12 determines a storage region (memory region) on the nonvolatile memory 2 for user data stored in the RAM 11. The user data is stored in the RAM 11 via the internal bus 16. The processor 12 determines a memory region for data in units of pages, which are a write unit, (page data). In the present description, user data stored in one page of the nonvolatile memory 2 is defined as unit data. The unit data is generally encoded by the ECC circuit 14 and is stored as a code word in the nonvolatile memory 2. In the present embodiment, encoding is not a requisite. The memory controller 1 may store unencoded unit data in the nonvolatile memory 2, but FIG. 1 illustrates a configuration in which encoding is executed as one configuration example. When the memory controller 1 does not execute encoding, page data matches unit data. One code word may be generated based on one piece of unit data or one code word may be generated based on divided data obtained by dividing the unit data. One code word may be generated using a plurality of pieces of unit data.

The processor 12 determines a memory region of the nonvolatile memory 2 which is a write destination for each piece of unit data. A physical address is allocated to the memory region of the nonvolatile memory 2. The processor 12 manages the memory region which is a write destination of the unit data using the physical address. The processor 12 designates the determined memory region (physical address) and instructs the memory interface 15 to write the user data in the nonvolatile memory 2. The processor 12 manages correspondence between a logical address (a logical address managed by the host) and the physical address of the user data. When a read request including the logical address from the host is received, the processor 12 specifies a physical address corresponding to the logical address, designates the physical address, and instructs the memory interface 15 to read user data.

The ECC circuit 14 encodes the user data stored in the RAM 11 to generate a code word. The ECC circuit 14 decodes a code word read from the nonvolatile memory 2.

The RAM 11 temporarily stores the user data received from the host until the user data is stored in the nonvolatile memory 2 or temporarily stores data read from the nonvolatile memory 2 until the data is transmitted to the host. The RAM 11 is, for example, a general-purpose memory such as a static random access memory (SRAM) or a dynamic random access memory (DRAM).

FIG. 1 illustrates a configuration example in which the memory controller 1 includes the ECC circuit 14 and the memory interface 15. The ECC circuit 14 may be included in the memory interface 15. The ECC circuit 14 may be included in the nonvolatile memory 2.

When a write request is received from the host, the memory system operates as follows. The processor 12 temporarily stores data which is a write target in the RAM 11. The processor 12 reads the data stored in the RAM 11 and inputs the read data to the ECC circuit 14. The ECC circuit 14 encodes the input data and inputs the code word to the memory interface 15. The memory interface 15 writes the input code word in the nonvolatile memory 2.

When a read request is received from the host, the memory system operates as follows. The memory interface 15 inputs the code word read from the nonvolatile memory 2 to the ECC circuit 14. The ECC circuit 14 decodes the input code word and stores the decoded data in the RAM 11. The processor 12 transmits the data stored in the RAM 11 to the host via the host interface 13.

1-2. Configuration of Nonvolatile Memory

Figure 2:
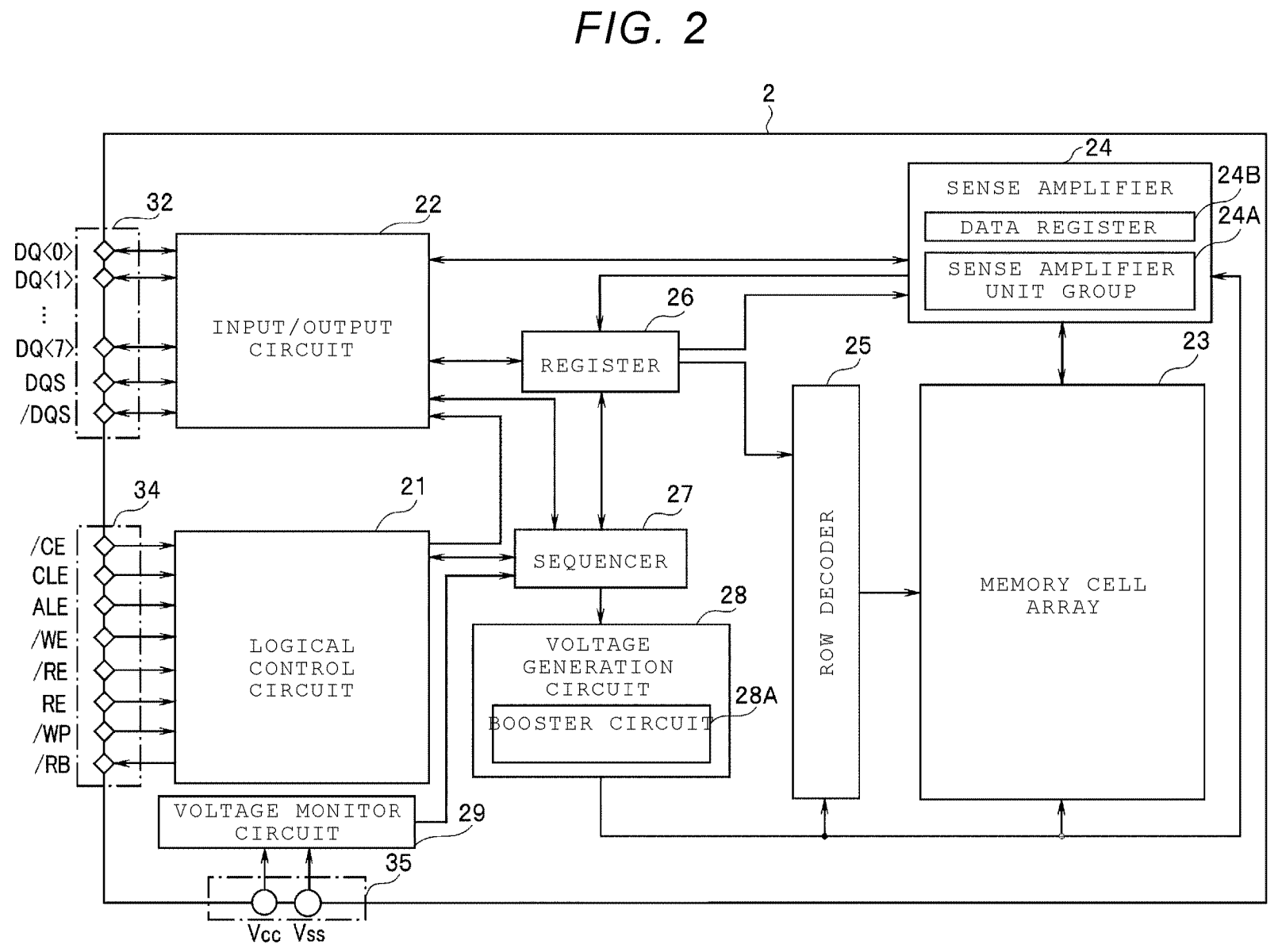

FIG. 2 is a block diagram illustrating a configuration example of the nonvolatile memory according to the first embodiment. The nonvolatile memory 2 includes a logical control circuit 21, an input/output circuit 22, a memory cell array 23, a sense amplifier 24, a row decoder 25, a register 26, a sequencer 27, a voltage generation circuit 28, a voltage monitor circuit 29, an input/output pad group 32, a logical control pad group 34, and a power input terminal group 35.

The memory cell array 23 includes a plurality of blocks. Each of a plurality of blocks BLK includes a plurality of memory cell transistors (memory cells). In the memory cell array 23, a plurality of bit lines, a plurality of word lines, source lines, and the like are provided to control voltages applied to the memory cell transistors. A specific configuration of the block BLK will be described below.

Since the input/output pad group 32 transmits and receives each signal including data to and from the memory controller 1, the input/output pad group 32 includes a plurality of terminals t (pads) corresponding to the signals DQ<7:0> and the data strobe signals DOS and /DQS.

Since the logical control pad group 34 transmits and receives each signal to and from the memory controller 1, the logical control pad group 34 includes a plurality of terminals (pads) corresponding to the chip enable signal /CE, the command latch enable signal CLE, the address latch enable signal ALE, the write enable signal /WE, the read enable signals RE and /RE, the write protection signal /WP, and the ready busy signal /RB.

The chip enable signal /CE is employed to enable selection of the nonvolatile memory 2. The command latch enable signal CLE is employed to enable commands transmitted as the signals DQ<7:0> to be latched in command registers. The address latch enable signal ALE is employed to enable addresses transmitted as the signals DQ<7:0> to be latched in the address registers. The write enable signal /WE is employed to enable writing. The read enable signal RE is employed to enable reading. The write protection signal /WP is employed to prohibit writing and erasing. The ready busy signal /RB indicates whether the nonvolatile memory 2 is in a ready state (a state in which a command from the outside can be received) or a busy state (a state in which a command from the outside cannot be received). The memory controller 1 can know a state of the nonvolatile memory 2 by receiving the ready busy signal /RB.

Since the power input terminal group 35 supplies various types of operation power from the outside to the nonvolatile memory 2, the power input terminal group 35 includes a plurality of terminals to which a power voltage Vcc and a ground voltage Vss are input. The power input terminal group 35 may include a plurality of terminals to which a power voltage VccQ and Vpp are input in addition to the plurality of terminals to which the power voltage Vcc and the ground voltage Vss are input. The power voltage Vcc is a circuit power voltage generally supplied as operation power from the outside. For example, a voltage of about 2.5 V or 3.3 V is input. In general, in a specification, a data sheet, or the like, a range of a voltage value of the voltage Vcc at which the nonvolatile memory normally operates is determined. For example, the range is 2.35 V to 3.6 V. As the power voltage VccQ, for example, a voltage of 1.2 V or 1.8 V is input. The power voltage VccQ is used when a signal is transmitted and received between the memory controller 1 and the nonvolatile memory 2.

The power voltage Vpp is a power voltage higher than the power voltage Vcc. For example, a voltage of 12 V is input. When data is written or data is erased in the memory cell array 23, a high voltage of about 20 V is necessary. At this time, a desired voltage can be generated at a high speed and low power consumption by boosting the power voltage Vpp of about 12 V rather than boosting the power voltage Vcc of about 3.3 V by a booster circuit of the voltage generation circuit 28. The power voltage Vcc is power normally supplied to the nonvolatile memory 2 and the power voltage Vpp is, for example, power supplied additionally or optionally depending on a use environment.

The logical control circuit 21 and the input/output circuit 22 are connected to the memory controller 1 via a NAND bus. The input/output circuit 22 transmits and receives signals DQ (for example, DQ0 to DQ7) to and from the memory controller 1 via the NAND bus.

The logical control circuit 21 receives external control signals (for example, the chip enable signal /CE, the command latch enable signal CLE, the address latch enable signal ALE, the write enable signal /WE, the read enable signals RE and /RE, and the write protection signal /WP) from the memory controller 1 via the NAND bus. The logical control circuit 21 transmits the ready busy signal /RB to the memory controller 1 via the NAND bus.

The input/output circuit 22 transmits and receives the signals DQ<7:0> and the data strobe signals DQS and /DQS to and from the memory controller 1. The input/output circuit 22 transfers commands and addresses in the signals DQ<7:0> to the registers 26. The input/output circuit 22 transmits and receives write data and read data to and from the sense amplifier 24.

The register 26 includes a command register, an address register, a status register and the like. The command register temporarily stores a command. The address register temporarily stores an address. The status register temporarily stores data necessary to operate the nonvolatile memory 2. The register 26 is configured with, for example, an SRAM.

The sequencer 27 serving as a control circuit receives the command from the register 26 and controls the nonvolatile memory 2 in accordance with a sequence which is based on the command.

The voltage generation circuit 28 includes a booster circuit 28A. The booster circuit 28A receives a power voltage from the outside of the nonvolatile memory 2, boosts the power voltage, and generates a plurality of voltages used for a write operation, a read operation, and an erasing operation. The voltage generation circuit 28 supplies the voltages generated by the booster circuit 28A to the memory cell array 23, the sense amplifier 24, the row decoder 25, and the like. A detailed configuration of the booster circuit 28A will be described with reference to FIG. 4 to be described below.

The voltage monitor circuit 29 measures a voltage value of the voltage Vcc supplied from the outside and outputs voltage value information of the voltage Vcc to the sequencer 27. The voltage value measurement can be performed at any applicable frequency depending on the memory system. The frequency of performing the voltage value measurement is set, for example, for each operation such as a write operation, a read operation, and an erasing operation or for each power-ON input as power. For example, a voltage value may be measured for each given period of time such as one to tens or hundreds of see, msec, or usec.

The row decoder 25 receives a row address from the register 26 and decodes the row address. The row decoder 25 executes an operation of selecting a word line based on the decoded row address. The row decoder 25 transfers a plurality of voltages necessary for a write operation, a read operation, and an erasing operation to a selected block.

The sense amplifier 24 receives a column address from the register 26 and decodes the column address. The sense amplifier 24 includes a sense amplifier unit group 24A and a data register 24B. The sense amplifier unit group 24A is connected to each bit line and selects any bit line based on the decoded column address. The sense amplifier unit group 24A detects and amplifies data read from a memory cell transistor to a bit line during reading of the data. The sense amplifier unit group 24A transfers write data to a bit line during writing of data.

The data register 24B temporarily stores the data detected by the sense amplifier unit group 24A during reading of the data and transfers the stored data to the input/output circuit 22 serially. The data register 24B temporarily stores the data serially transferred from the input/output circuit 22 during writing of the data and transfers the stored data to the sense amplifier unit group 24A. The data register 24B is configured with an SRAM and the like.

1-3. Block Configuration of Memory Cell Array

Figure 3:
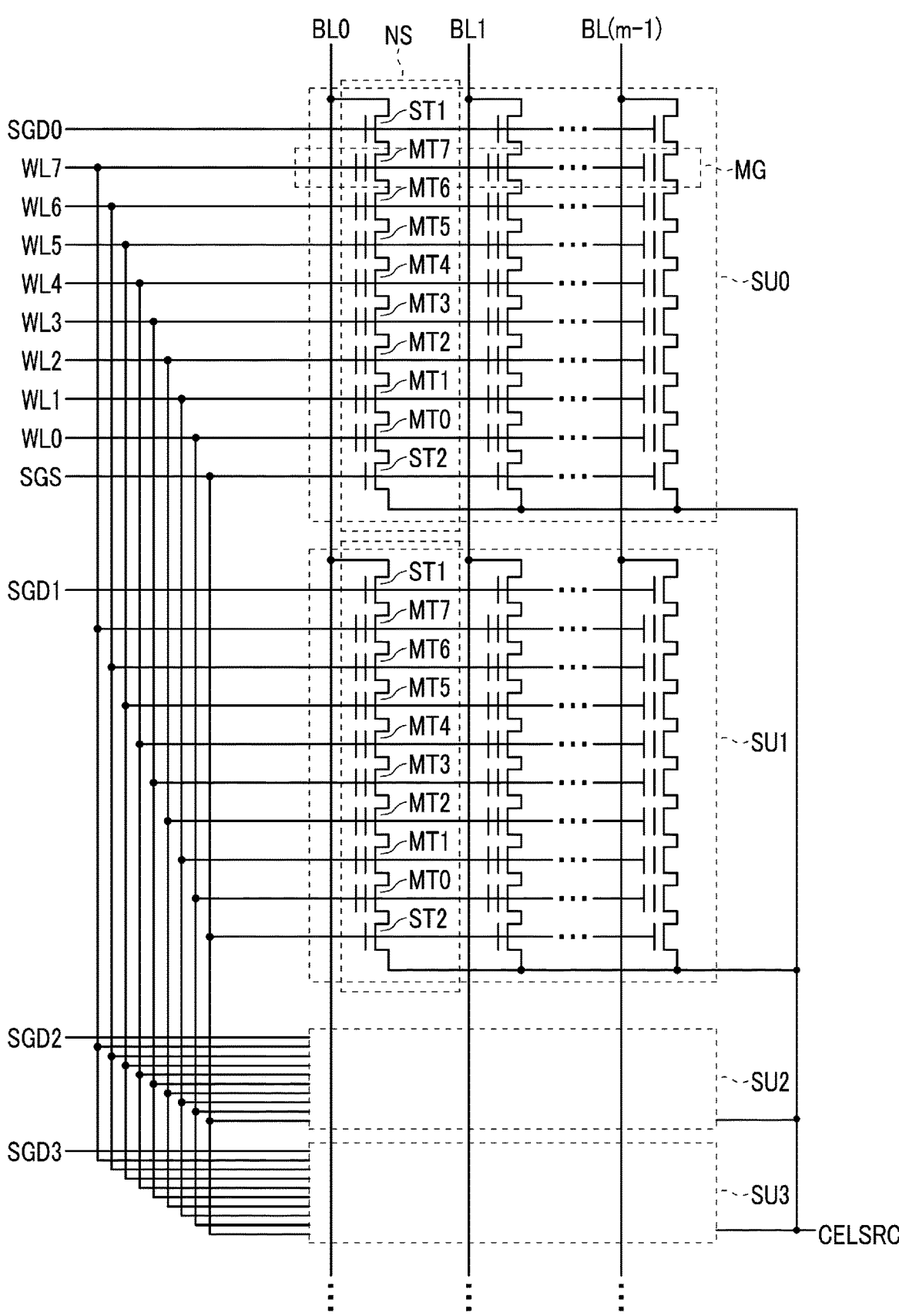
FIG. 3 is a diagram illustrating a configuration example of a block of a memory cell array that has a 3-dimensional structure.

FIG. 3 is a diagram illustrating a configuration example of a block of the memory cell array 23 that has a 3-dimensional structure. FIG. 3 illustrates one block BLK among a plurality of blocks provided in the memory cell array 23. The other blocks of the memory cell array have similar configurations to the configuration of FIG. 3. The present disclosure can also be applied to a memory cell array that has a 2-dimensional structure.

As illustrated, the block BLK includes, for example, four string units (SU0 to SU3). Each string unit SU includes a plurality of NAND strings NS. Here, each NAND string NS includes eight memory cell transistors MT (MT0 to MT7) and select gate transistors ST1 and ST2. The memory cell transistor MT includes a gate and a charge storage layer and stores data in a nonvolatile manner. The number of memory cell transistors MT provided in the NAND string NS is eight for convenience, but more memory cell transistors may be used.

The select gate transistors ST1 and ST2 are illustrated as one transistor on an electric circuit, but may be the same as the memory cell transistors in a structure. For example, in order to enhance cutoff characteristics, a plurality of select gate transistors may be used as each of the select gate transistors ST1 and ST2. Further, dummy cell transistors may be provided between the memory cell transistors MT and the select gate transistors ST1 and ST2.

The memory cell transistors MT are connected in series between the select gate transistors ST1 and ST2. A memory cell transistor MT7 on one end side is connected to the select gate transistor ST1 and a memory cell transistor MT0 on the other end side is connected to the select gate transistor ST2.

The gates of the select gate transistor ST1 of each of the string units SU0 to SU3 are respectively connected to selected gate lines SGD0 to SGD3 (hereinafter referred to as the selected gate lines SGD when it is not necessary to distinguish the selected gate lines SGD0 to SGD3 from each other). Meanwhile, the gate of the select gate transistor ST2 is commonly connected to the same selected gate line SGS between the plurality of string units SU in the same block BLK. The gates of the memory cell transistors MT0 to MT7 in the same block BLK are respectively commonly connected to the word lines WL0 to WL7. That is, the word lines WL0 to WL7 and the selected gate line SGS are commonly connected between the plurality of string units SU0 to SU3 in the same block BLK, and the selected gate line SGD is independent for each of the string units SU0 to SU3 in the same block BLK.

The word lines WL0 to WL7 are respectively connected to the gates of the memory cell transistors MT0 to MT7 provided in the NAND string NS. A gate of a memory cell transistor MTi in the same row in the block BLK is connected to the same word line WLi. In the following description, the NAND string NS is simply referred to as a "string" in some cases.

Each NAND string NS is connected to a corresponding bit line. Accordingly, each memory cell transistor MT is connected to the bit line via the select gate transistor ST or another memory cell transistor MT provided in the NAND string NS. Data in the memory cell transistors MT in the same block BLK is collectively erased. Meanwhile, data is read and written in units of memory cell groups MG (or units of pages). In the present description, a plurality of memory cell transistors MT connected to one word line WLi and belonging to one string unit SU are defined as a memory cell group MG. During a read operation and a write operation, one word line WLi and one selected gate line SGD are selected and a memory cell group MG is selected in accordance with a physical address.

Configuration of Sequencer and Booster Circuit

Figure 4:
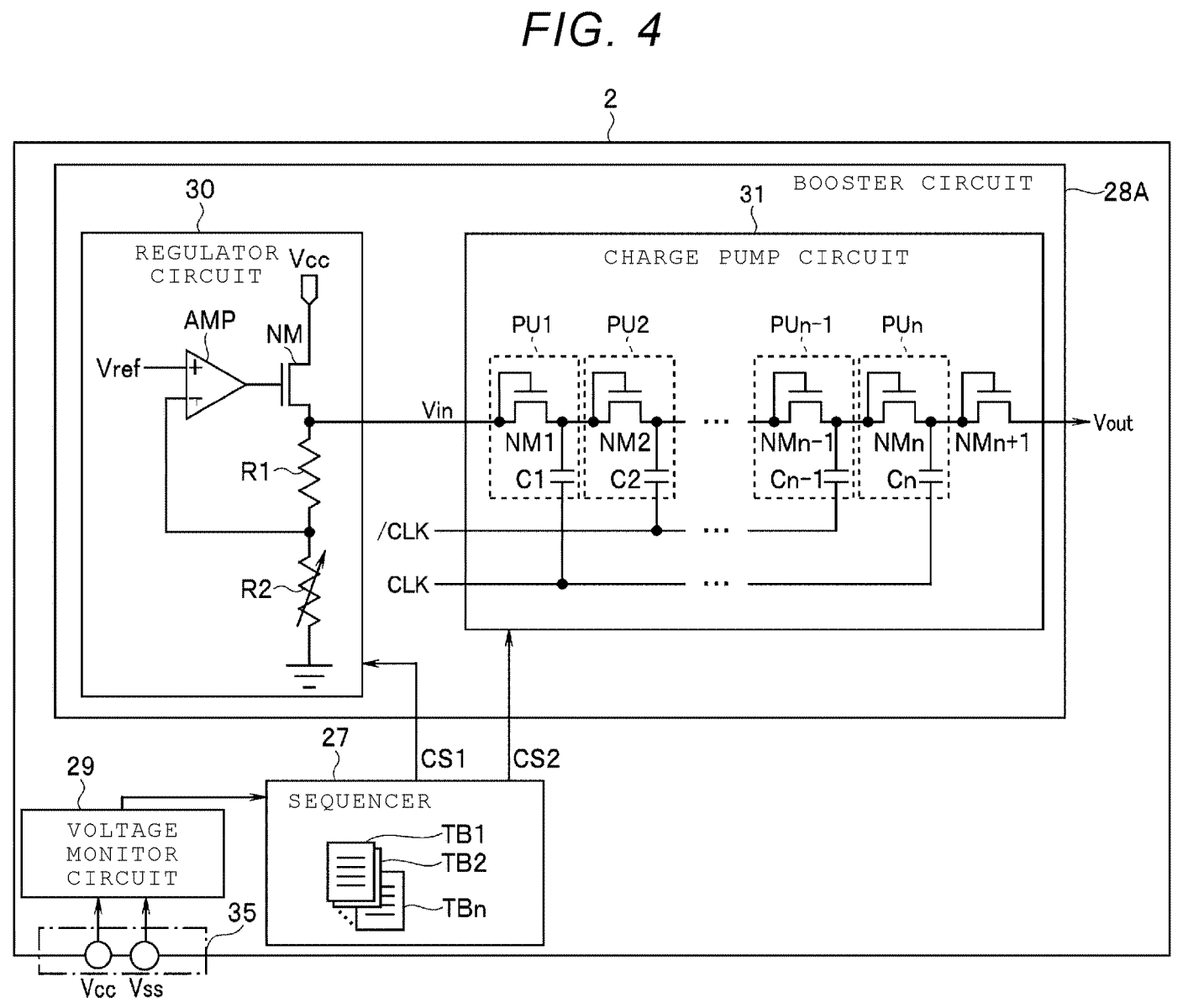

FIG. 4 is a diagram illustrating an example of a configuration of a sequencer and a booster circuit according to the first embodiment.

The sequencer 27 has a plurality of lookup tables TB1, TB2, . . . , and TBn. The plurality of lookup tables TB1, TB2, . . . , and TBn each correspond to sixteen pieces of voltage value information from 2.4 V to 3.9 V in a 0.1 V step. Alternatively, the plurality of lookup tables TB1, TB2, . . . , and TBn each may correspond to thirty two pieces of voltage value information from 2.4 V to 3.9 V in a 0.05 V step. Alternatively, the plurality of lookup tables TB1, TB2, . . . , and TBn each may correspond to eight pieces of voltage value information from 2.4 V to 3.9 V in a 0.2 V step, for example. A step width may not be constant and may be varied to, for example, any of about 0.05 V to 0.2 V steps.

The booster circuit 28A includes a regulator circuit 30 and a charge pump circuit 31.

The regulator circuit 30 includes an NMOS transistor NM, an amplifier AMP, a resistor R1, and a variable resistor R2. The regulator circuit 30 regulates the input voltage Vcc. In other words, the regulator circuit 30 smooths voltage levels of the input voltage Vcc and outputs constant voltage and current. The voltage regulated by the regulator circuit 30 is input as an input voltage Vin to the charge pump circuit 31. The regulator circuit 30 is not limited to the configuration illustrated in FIG. 4 and may have another configuration. For example, the regulator circuit 30 may have a configuration in which PMOS transistors are provided instead of the NMOS transistors NM.

The charge pump circuit 31 includes, for example, NMOS transistors NM1 to NMn+1 and capacitors C1 to Cn. The charge pump circuit 31 boosts the input voltage Vin and outputs an output voltage Vout.

In the lookup tables TB1 to TBn, voltage value information of the voltage Vcc is associated with information regarding control signals CS1 and CS2 corresponding to the voltage value information. The control signal CS1 is a control signal for changing a resistant value of the variable resistor R2 and controlling an input voltage input from the regulator circuit 30 to the charge pump circuit 31. The control signal CS2 is a control signal for controlling the number of stages in the charge pump circuit 31. The number of stages in the charge pump circuit 31 corresponds to the number of steps of voltage boosting by the charge pump units to be described below.

Based on the voltage value information of the voltage Vcc input from the voltage monitor circuit 29, the sequencer 27 generates, for example, various digital signals such as about 8 types (3 bits) to 32 types (5 bits) code CDs with reference to the lookup tables TB value information. The corresponding to the voltage sequencer 27 outputs the generated various digital signals as the control signals CS1 and CS2 to the regulator circuit 30 and the charge pump circuit 31.

The NMOS transistor NM of the regulator circuit 30 includes a drain terminal to which the voltage Vcc is input, a gate terminal to which a control signal is input, and a source terminal from which an output voltage is output. The output voltage output from the source terminal is input as the input voltage Vin to the charge pump circuit 31.

The resistor R1 and the variable resistor R2 are connected in series between the source terminal of the NMOS transistor NM and the ground. The resistor R1 and the variable resistor R2 are used to divide an output voltage. A feedback voltage obtained by dividing the output voltage is output from a connection point of the resistor R1 and the variable resistor R2 to the amplifier AMP.

In the amplifier AMP, a reference voltage Vref is supplied to a non-inverted input terminal and the feedback voltage is supplied to an inverted input terminal. The amplifier AMP outputs a control signal in accordance with a difference between the reference voltage Vref and the feedback voltage to the gate terminal of the NMOS transistor NM. The amplifier AMP controls the control signal such that the feedback voltage becomes equal to the reference voltage Vref, and thus the output voltage output from the source terminal of the NMOS transistor NM is changed.

A resistant value of the variable resistor R2 varies by the control signal CS1 from the sequencer 27. By varying the resistant value of the variable resistor R2, a control operation is performed such that the feedback voltage input from the connection point of the resistor R1 and the variable resistor R2 to the amplifier AMP is always equal to the reference voltage Vref. As a result, an output voltage output from the regulator circuit 30, in other words, the input voltage Vin input to the charge pump circuit 31, varies. In this way, the regulator circuit 30 changes the input voltage Vin supplied to the charge pump circuit 31 in accordance with the control signal CS1 from the sequencer 27.

In general, an output current Iout of the charge pump circuit is expressed in the following Formula (1).

$$Iout = C \times ((N + 1) \times Vin - Vout)/(N \times Tclk) \qquad (1)$$

In Formula (1), C is a capacitance in the charge pump circuit, N is the number of stages, Vin is an input voltage to the charge pump circuit, Vout is an output voltage from the charge pump circuit, and Tolk is a clock period. As apparent from Formula (1), the output current Iout of the charge pump circuit depends on the input voltage Vin. That is, in the charge pump circuit, the larger the input voltage Vin is, the larger the output current is. In the related art, in order to supply a constant output current, an input voltage value of the charge pump circuit is constant irrespective of the voltage Vcc. That is, a regulator circuit in a booster circuit of the related art regulates the voltage Vcc input from the outside to about a lowest voltage determined in a specification and supplies the regulated voltage to the charge pump circuit. Accordingly, for all the voltages Vcc having voltage values in a range determined in a specification, a required boosting operation is guaranteed. However, the voltage Vcc input from the outside to the nonvolatile memory 2 is sufficiently higher than the lowest voltage determined in the specification in many cases. Therefore, in the related art, an input voltage is dropped by the regulator circuit, the dropped voltage is boosted by the charge pump circuit, and thus power efficiency of the booster circuit is low.

Meanwhile, the regulator circuit 30 according to the present embodiment changes a resistant value of the variable resistor R2 in accordance with the control signal CS1, regulates the voltage Vcc from the voltage Vcc to a voltage in an extent that is necessary for smoothing or an extent that can absorb unintentionally occurred variation amount of the voltage Vcc, and supplies the regulated voltage to the charge pump circuit 31. That is, a voltage amount decreased from the voltage Vcc by the regulator circuit is small. Therefore, in many cases, the regulator circuit 30 supplies the charge pump circuit 31 with a voltage higher than the lowest voltage determined in the specification in accordance with the voltage value of the voltage Vcc input from the outside.

The NMOS transistors NM1 to NMn+1 of the charge pump circuit 31 are respectively connected to diodes and cause currents to flow in only one direction from the input side to the output side. The NMOS transistors NM1 to NMn+1 are connected in series from the input side to the output side.

One end of each of capacitors C1 to Cn is electrically connected to a node between the NMOS transistors NM1 and the NM2 to a node between the NMOS transistors NMn and NMn+1. A clock signal CLK is supplied to the other ends of the capacitors C1, C3, . . . , and Cn, and an inverted clock signal /CLK obtained by inverting the clock signal CLK is input to the other ends of the capacitors C2, C4, . . . , and Cn−1. Power of the clock signal CLK is the input voltage Vin.

The input voltage Vin is input to one end of the NMOS transistor NM1. At a timing at which the clock signal CLK is in a low (L) state and the inverted clock signal /CLK is in a high (H) state, a voltage equal to the input voltage Vin is output from the other end of the NMOS transistor NM1 and one end of the capacitor C1 is charged. Subsequently, at a timing at which the clock signal CLK is in the high (H) and the inverted clock signal /CLK is in the low (L) state, the one end of the capacitor C1 is boosted to a voltage of 2×Vin due to an influence of a change at the other end of the capacitor C1 from the low (L) state to the high (H) state, the voltage is discharged from the one end of the capacitor C1 and is input to one end of the NMOS transistor NM2. Charging and discharging are repeated in the capacitors C1 to Cn by the clock signals CLK and /CLK. As a result, the output voltage Vout higher than the supplied input voltage Vin is generated and the output voltage Vout is output from the other end of the NMOS transistor NMn+1.

In the charge pump circuit 31, the charge pump unit PU includes one NMOS transistor NM and one capacitor C. For example, the charge pump unit PU1 includes the NMOS transistor NM1 and the capacitor C1, and the charge pump unit PU2 includes the NMOS transistor NM2 and the capacitor C2. As the number of charge pump units connected in series, that is, the number of steps of voltage boosting by the charge pump units PU, in other words, the number of stages, is larger, a higher voltage can be output. In the example of FIG. 4, the charge pump circuit 31 includes charge pump units PU1 to PUn. The charge pump unit PU1 boost the input voltage Vin and outputs a voltage of 2×Vin to the charge pump unit PU2. Similarly, the charge pump unit PU2 boosts the voltage of 2×Vin and outputs a voltage of 3×Vin. Similarly, the charge pump unit PUn boosts the voltage of N×Vin and outputs a voltage of (N+1)× Vin. By changing the number of stages of the charge pump units, it is possible to obtain a desired voltage in the charge pump circuit 31. The charge pump circuit 31 changes the number of steps of voltage boosting by the charge pump units PU, in other words, the number of stages, in accordance with the control signal CS2 from the sequencer 27.

That is, the charge pump circuit 31 changes the number of stages in accordance with a target value of a voltage to be boosted based on the control signal CS2. The charge pump circuit 31 boosts the input voltage Vin input from the regulator circuit 30 according to the number of stages, and generates and outputs a plurality of voltages used for a write operation, a read operation, an erasing operation, and the like.

Figure 5A:
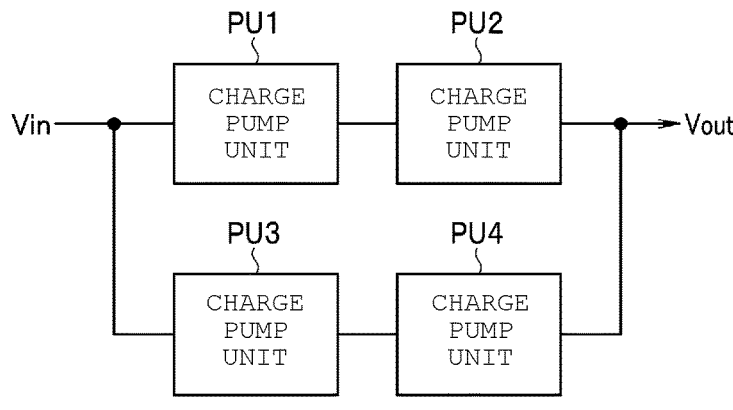
FIG. 5A is a diagram illustrating an example in which the number of stages of charge pump units is two in a charge pump circuit.
Figure 5B:
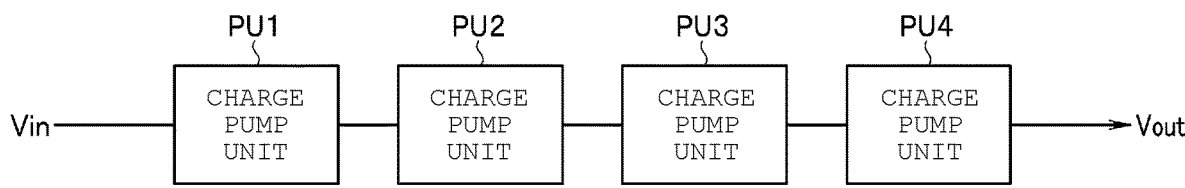
FIG. 5B is a diagram illustrating an example in which the number of stages of charge pump units is four in the charge pump circuit.

The charge pump circuit 31 changes the connection between the charge pump units PU in accordance with the control signal CS2, for example, as illustrated in FIGS. 5A and 5B. FIG. 5A is a diagram illustrating an example in which the number of stages of charge pump units is two in the charge pump circuit 31. FIG. 5B is a diagram illustrating an example in which the number of stages of charge pump units is four in the charge pump circuit 31.

As illustrated in FIG. 5A, when the output voltage Vout which is three times the input voltage Vin is output, the charge pump units PU1 and PU2 are connected in series and charge pump units PU3 and PU4 are connected in parallel to the charge pump units PU1 and PU2.

The charge pump unit PU1 boosts the input voltage Vin and outputs the voltage of 2×Vin to the charge pump unit PU2. The charge pump unit PU2 boosts the voltage of 2×Vin and outputs a voltage of 3×Vin.

The charge pump unit PU3 boosts the input voltage Vin and outputs the voltage of 2×Vin to the charge pump unit PU4. The charge pump unit PU4 boosts the voltage of 2×Vin and outputs the voltage of 3×Vin. Since the charge pump units PU1 and PU2 and the charge pump units PU3 and PU4 are connected in parallel, the output voltage Vout which is three times the input voltage Vin is output from the charge pump circuit 31. In the case of the configuration in which the charge pump units PU1 and PU2 and the charge pump units PU3 and PU4 are connected in parallel, an output current is about twice larger than in the case of the configuration in which only the charge pump units PU1 and PU2 are connected in series.

As illustrated in FIG. 5B, when a voltage which is five times the input voltage Vin is output, the charge pump units PU1 to PU4 are connected in series.

The charge pump unit PU1 boosts the input voltage Vin and outputs the voltage of 2×Vin to the charge pump unit PU2. The charge pump unit PU2 boosts the voltage of 2×Vin and outputs a voltage of 3×Vin. The charge pump unit PU3 boosts the voltage of 3×Vin and outputs a voltage of 4×Vin. The charge pump unit PU4 boosts the voltage of 4×Vin and outputs a voltage of 5×Vin. Accordingly, an output voltage Vout which is five times the input voltage Vin is output from the charge pump circuit 31.

In the charge pump circuit illustrated in FIG. 5A, two charge pump units PU connected in series (the number of stages N=2) are connected in parallel in two columns. Therefore, an output current Iout of the charge pump circuit illustrated in FIG. 5A is expressed in the following Formula (1A).

$$Iout = 2 \times C \times (3 \times Vin - Vout)/(2 \times Tclk) \qquad \text{(1A)}$$

In the charge pump circuit illustrated in FIG. 5B, four charge pump units PU connected in series (the number of stages N=4) are connected in one column. Therefore, an output current Iout of the charge pump circuit illustrated in FIG. 5B is expressed in the following Formula (1B).

$$Iout = C \times (5 \times Vin - Vout)/(4 \times Tclk) \qquad \text{(1B)}$$

As described above, the output current in the case illustrated in FIG. 5B is less than the output current in the case illustrated in FIG. 5A.

FIGS. 5A and 5B illustrate examples in which the number of charge pump units PU in the charge pump circuit 31 is four, but this number is just an example. Any number of charge pump units PU may be used. For example, ten or more or several tens or more of charge pump units may be used. The parallels number of charge pump units PU connected in parallel may be three or more. Similarly, the number (the number of stages) of charge pump units PU connected in series may be five or more.

Figure 6A:
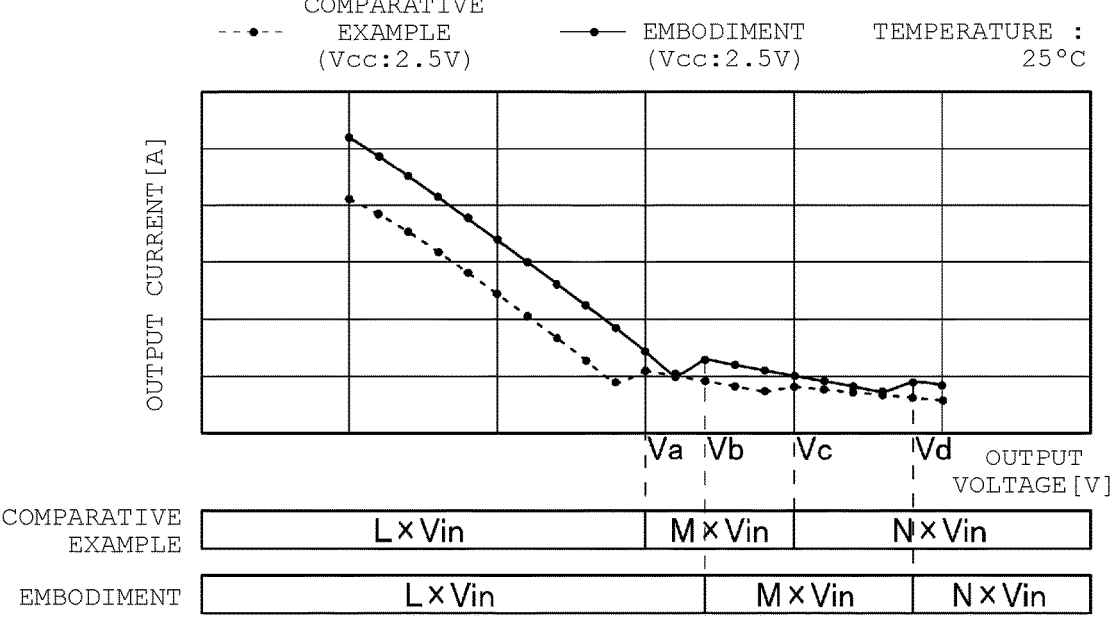
FIG. 6A is a diagram illustrating a relation between an output voltage and an output current of the booster circuit.
Figure 6B:
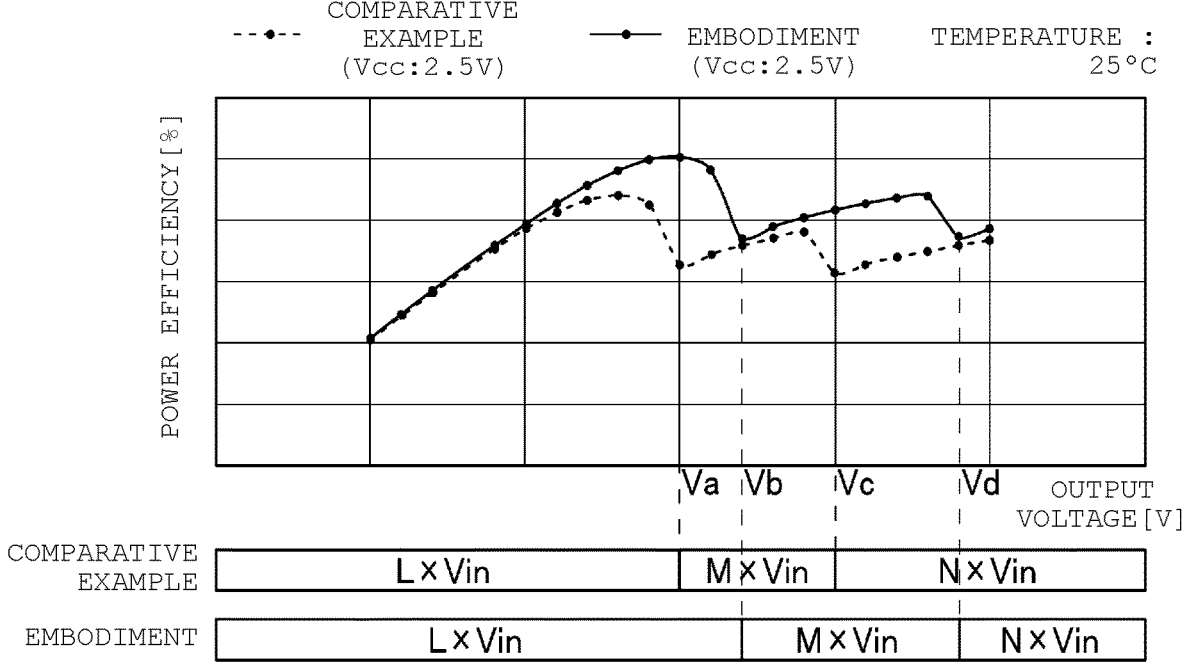
FIG. 6B is a diagram illustrating a relation between an output voltage and a power efficiency of the booster circuit.

FIG. 6A is a diagram illustrating a relation between an output voltage and an output current of the booster circuit. FIG. 6B is a diagram illustrating a relation between an output voltage and power efficiency of the booster circuit.

In FIG. 6A, a dotted line represents a relation between an output voltage and an output current according to a comparative example, and a solid line represents a relation between an output voltage and an output current according to the present embodiment. In FIG. 6B, a dotted line represents a relation between an output voltage and power efficiency according to the comparative example, and a solid line represents a relation between an output voltage and power efficiency according to the present embodiment. In both the comparative example and the present embodiment, the conditions are that the voltage Vcc is 2.5 V and a temperature is 25° C.

In FIGS. 6A and 6B, L, M, and N each represent the number of stages of the charge pump circuit 31. L, M, and N are each a positive integer and have a relation of L<M<N.

In the comparative example, the voltage Vcc input from the outside is regulated to about the lowest voltage determined in the specification to be supplied to the charge pump circuit. The charge pump circuit switches the number of stages so that the output voltage Vout is not lower than a desired voltage value. In other words, on the assumption that "(N+1)×Vin−Vout" in Formula (1) is a positive number, "(N+1)×input voltage Vin" is higher than the output voltage Vout. When a high output voltage Vout is needed, it is necessary to switch the number of stages. Therefore, in the comparative example, when the output voltage becomes Va, the number of stages is switched from L to M, and when the output voltage becomes Vc, the number of stages is switched from M to N.

On the other hand, in the present embodiment, an output voltage of the regulator circuit 30 is controlled in accordance with a voltage value of the voltage Vcc such that the input voltage Vin higher than in the comparative example is supplied to the charge pump circuit 31. Since the input voltage Vin higher than in the comparative example is supplied to the charge pump circuit 31, an output voltage of the charge pump circuit 31 that can be output in accordance with the same number of stages is higher than in the comparative example. When the number of stages is switched so that the output voltage Vout is not lower than a desired voltage value, the input voltage Vin is higher than in the comparative example. Therefore, at a timing at which the number of stages is switched, the output voltage is higher than in the comparative example. Specifically, when the output voltage becomes Vb, the number of stages is switched from L to M. When the output voltage becomes Vd, the number of stages is switched from M to N.

Current efficiency Iout/Icc of the booster circuit 28A is expressed in the following Formula (2).

$$Iout/Icc \propto 1/(N+1) \qquad (2)$$

That is, the current efficiency Iout/Icc of the booster circuit 28A is inversely proportional to the number of stages N+1 of the charge pump unit PU.

Power efficiency Eff of the booster circuit 28A is expressed in the following Formula (3).

$$Eff = (Vout \times Iout)/(Vcc \times Icc) \qquad (3)$$

In Formulae (2) and (3), Vout is an output voltage of the booster circuit 28A (the charge pump circuit 31), Iout is an output current of the booster circuit 28A (the charge pump circuit 31), Vcc is a voltage input to the nonvolatile memory 2 (the booster circuit 28A), and Icc is a current input to the nonvolatile memory 2 (the booster circuit 28A). Therefore, the power efficiency Eff of the booster circuit 28A is inversely proportional to the number of stages N+1 of the charge pump unit PU. That is, when the number of stages of the charge pump units PU increases, the power efficiency Eff of the booster circuit 28A is lowered.

Therefore, as illustrated in FIG. 6B, in a period (a period of the output voltage from Va to Vb) in which M is the number of stages according to the comparative example and L is the number of stages according to the present embodiment, the power efficiency Eff is considerably improved. Similarly, in a period (a period of the output voltage from Vc to Vd) in which N is the number of stages according to the comparative example and M is the number of stages according to the present embodiment, the power efficiency Eff is considerably improved.

Even a period in which the number of stages according to the comparative example and the present embodiment is commonly L and the output voltage is close to Va, the power efficiency Eff is improved. This is because, in the comparative example, a current consumed by a peripheral circuit (not illustrated) such as a clock driver in the charge pump circuit 31 is dominant with respect to the output current and power efficiency deteriorates.

As described above, the sequencer 27 changes the input voltage Vin input from the regulator circuit 30 to the charge pump circuit 31 and the number of stages of the charge pump circuit 31 based on the voltage value information of the voltage Vcc input from the outside of the nonvolatile memory 2. As a result, the nonvolatile memory 2 can improve the power efficiency Eff of the booster circuit 28A.

Figure 7:
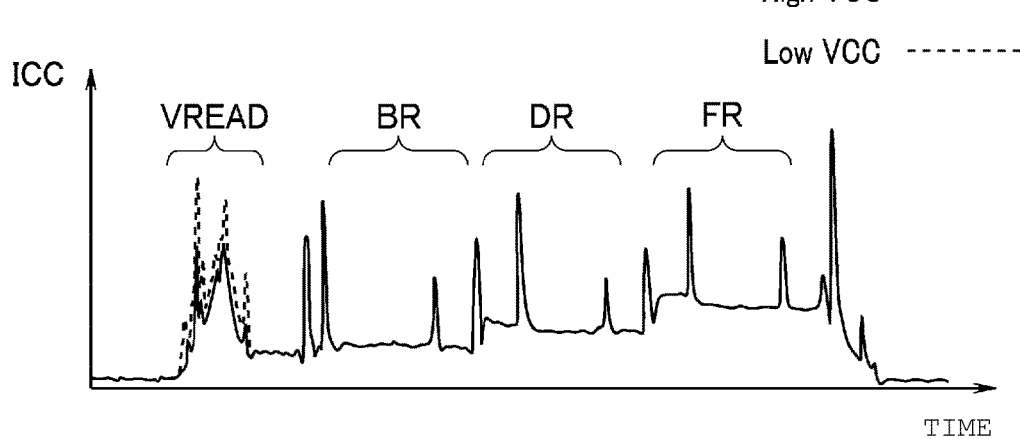
FIG. 7 is a diagram illustrating an example of an operation current during a read operation for a middle page of a 3 bits/cell (TLC) according to the first embodiment.

FIG. 7 is a diagram illustrating an example of an operation current ICC during a read operation for a middle page of a 3 bits/cell (TLC) according to the present embodiment. The operation current ICC can be obtained by measuring a terminal (pad) to which the power voltage Vcc is supplied.

In a read operation for a middle page of 3 bits/cell (TLC), read voltages BR, DR, and FR for reading triple values of the middle page subsequently to a read pass voltage VREAD are applied to selected word lines.

A waveform illustrated in FIG. 7 indicates a change in the operation current ICC flowing when the read pass voltage VREAD and the read voltages BR, DR, and FR are applied to the selected word lines.

According to the present embodiment, when the power voltage Vcc is high, it is possible to reduce a current when the read pass voltage VREAD is applied with respect to the current waveform during a time in which the power voltage Vcc is low.

This is because the output voltage Vout of the booster circuit 28A during supply of the read pass voltage VREAD is provided in the output voltage Vout in a range in which the power efficiency Eff is improved. The output voltage Vout in the range in which the power efficiency Eff is improved is in a range of the output voltage Vout in which the power efficiency is higher in the present embodiment than in the comparative example in FIG. 6B, for example.

The current Icc input to the nonvolatile memory 2 is expressed in the following Formula (3A).

$$Icc = (Vout \times Iout)/(Vcc \times Eff) \qquad (3A)$$

In an example illustrated in FIG. 7, the output voltage Vout of the booster circuit 28A is the same value when the power voltage Vcc is high and when the power voltage Vcc is low. When the power voltage Vcc is high, the output current Iout of the booster circuit 28A according to the present embodiment can be increased. In the example illustrated in FIG. 7, however, a ramp rate of the output voltage is constant. Therefore, the output current Iout is the same value when the power voltage Vcc is high and when the power voltage Vcc is low. Accordingly, the current Icc input to the nonvolatile memory 2 is inversely proportional to the power voltage Vcc and the power efficiency Eff. Accordingly, in a range of the output voltage Vout at which the power efficiency Eff is improved, the operation current ICC is reduced.

In this way, according to the present embodiment, it is possible to reduce the operation current ICC of the nonvolatile memory 2.

In the comparative example, even when the voltage Vcc is changed, an input voltage to the charge pump circuit is not changed and the number of stages during outputting of a predetermined voltage is not changed. Therefore, in the comparative example, as the voltage value of the voltage Vcc is higher, a voltage drop amount in the regulator circuit increases, the power efficiency Eff is reduced, and the operation current ICC increases or is not changed. In the present embodiment, however, as the voltage value of the voltage Vcc is higher, the number of stages when the charge pump circuit 31 outputs a predetermined voltage is decreased, the power efficiency Eff is improved, and the operation current ICC decreases. That is, a first operation current at which an operation is executed and which flows in a power voltage terminal when the power voltage is a first voltage value is less than a second operation current at which the operation is executed and which flows in the power voltage terminal when the power voltage is a second voltage value less than the first voltage value.

An increase or decrease in the operation current ICC is changed in an operation in which an output current from the charge pump circuit 31 is dominant. The operation in which the output current from the charge pump circuit 31 is dominant is, for example, an operation of applying a VPGM to a selected word line or an operation of applying a VPASS to a non-selected word line in a program operation in the case of a write operation, and is an operation of applying a read pass voltage VREAD to a non-selected word line in a verification operation. For example, the dominant operation is an operation of applying the read pass voltage VREAD in the case of a read operation, and is an operation of applying an erasing voltage VERA in the case of an erasing operation.

Second Embodiment

Next, a second embodiment will be described.

Figure 8:
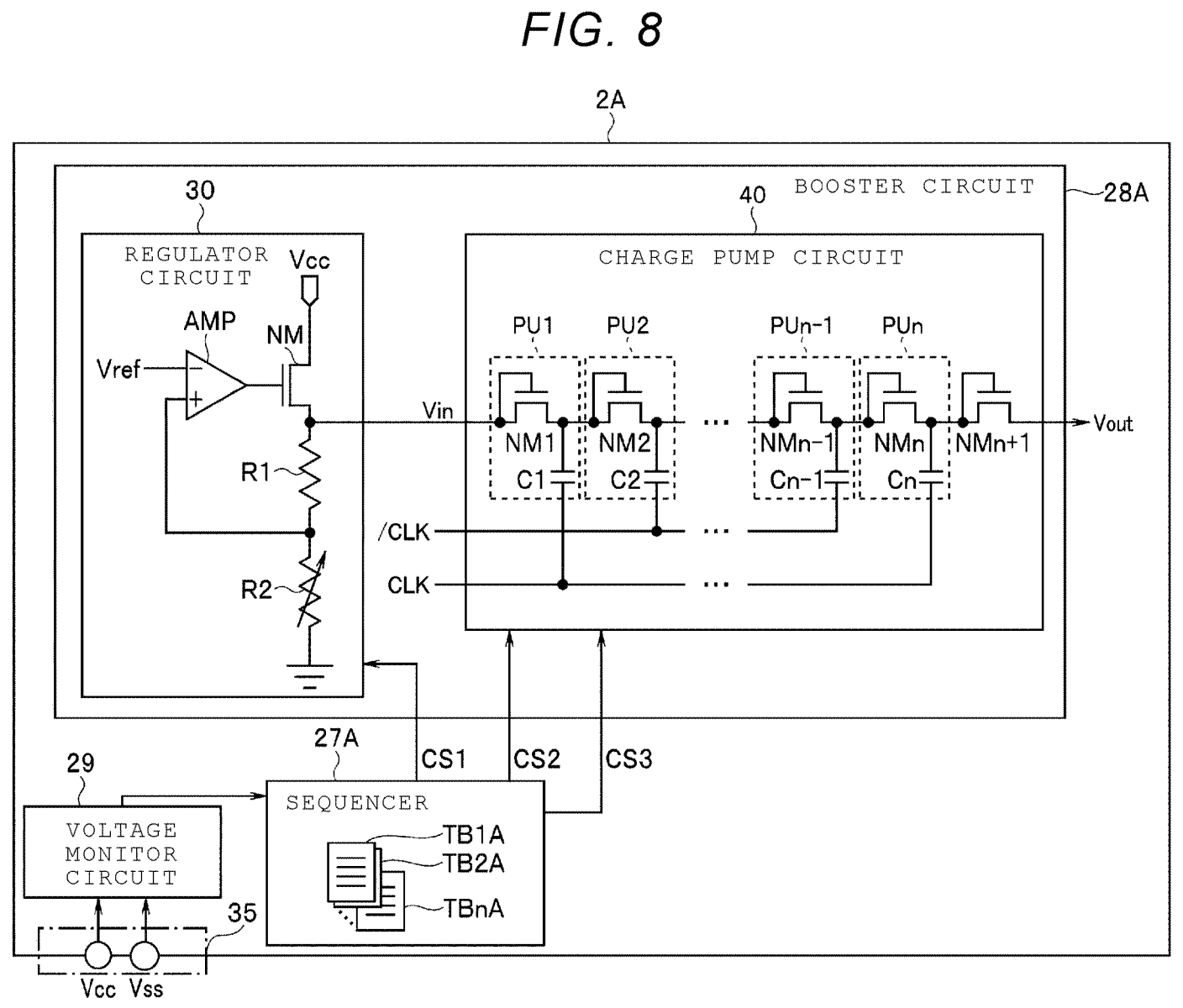

FIG. 8 is a diagram illustrating an example of a configuration of a sequencer and a booster circuit in a nonvolatile memory according to the second embodiment. In FIG. 8, the same reference numerals are given to configurations similar to those of FIG. 4, and description thereof will be omitted.

As illustrated in FIG. 8, a nonvolatile memory 2A includes a sequencer 27A instead of the sequencer 27 from the nonvolatile memory 2 of FIG. 4.

The sequencer 27A includes a plurality of lookup tables TB1A, TB2A, . . . , and TBnA.

In the lookup tables TB1A to TBnA, voltage value information of the voltage Vcc is associated with information regarding control signals CS1, CS2, and CS3 corresponding to the voltage value information. The control signal CS3 is a control signal for controlling a ramp rate of voltage boost by the charge pump circuit 31.

Based on the voltage value information of the voltage Vcc input from the voltage monitor circuit 29, the sequencer 27A outputs the control signal CS1 to the regulator circuit 30 and outputs the control signals CS2 and CS3 to the charge pump circuit 31 with reference to the lookup tables TB corresponding to the voltage value information.

The charge pump circuit 31 changes the number of stages based on the control signal CS2. The charge pump circuit 31 changes a ramp rate of the voltage boost based on the control signal CS3 to cause a rate of rise of a voltage to be faster.

Figure 9:
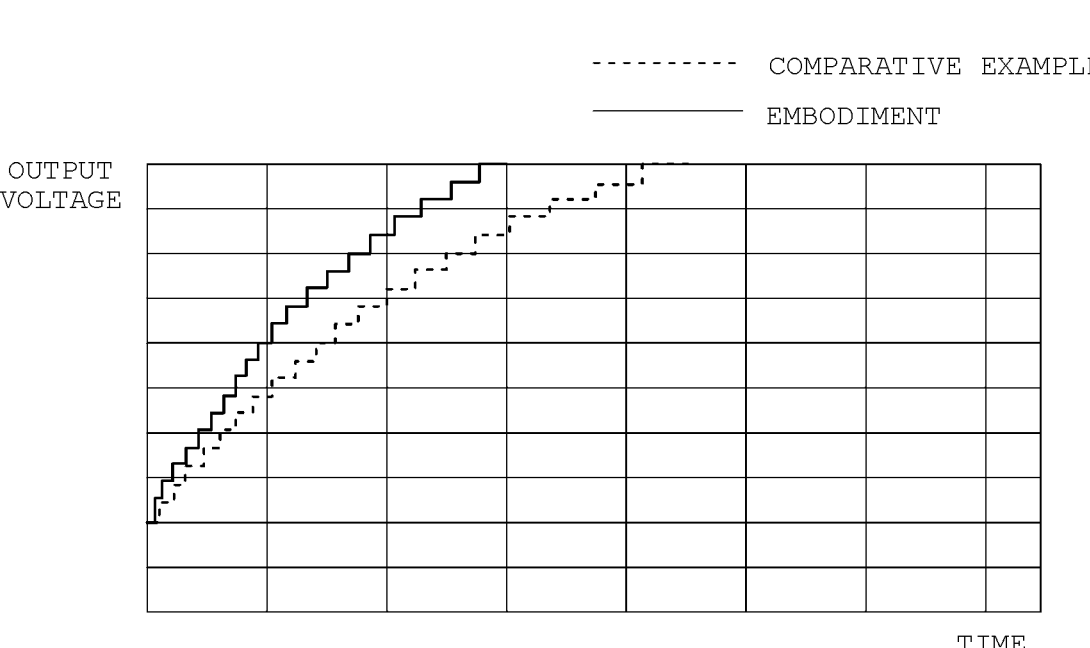
FIG. 9 is a waveform diagram illustrating an example of a ramp rate of a voltage.

FIG. 9 is a waveform diagram illustrating an example of a ramp rate of voltage boost of an output voltage of the charge pump circuit 31. In FIG. 9, a dotted line represents a ramp rate according to a comparative example and a solid line represents a ramp rate according to the present embodiment. As illustrated in FIG. 9, in the comparative example, a loose ramp rate is set in order to set an operation current constant or less. In the present embodiment, however, since power efficiency is improved, the ramp rate can be set to be steep while maintaining a constant or less operation current.

In a write operation, generally, a program operation and a verification operation are repeatedly executed after an operation of applying the read pass voltage VREAD. When one-time program operation and one-time verification operation are defined as one loop, any applicable number of loops is executed. In the program operation, a program voltage VPGM is applied to a word line WL and data is applied to a bit line BL. The verification operation is an operation of reading data of the memory cell transistor after the program operation and determining whether a threshold voltage of the memory cell transistor reaches a desired level.

Figure 10:
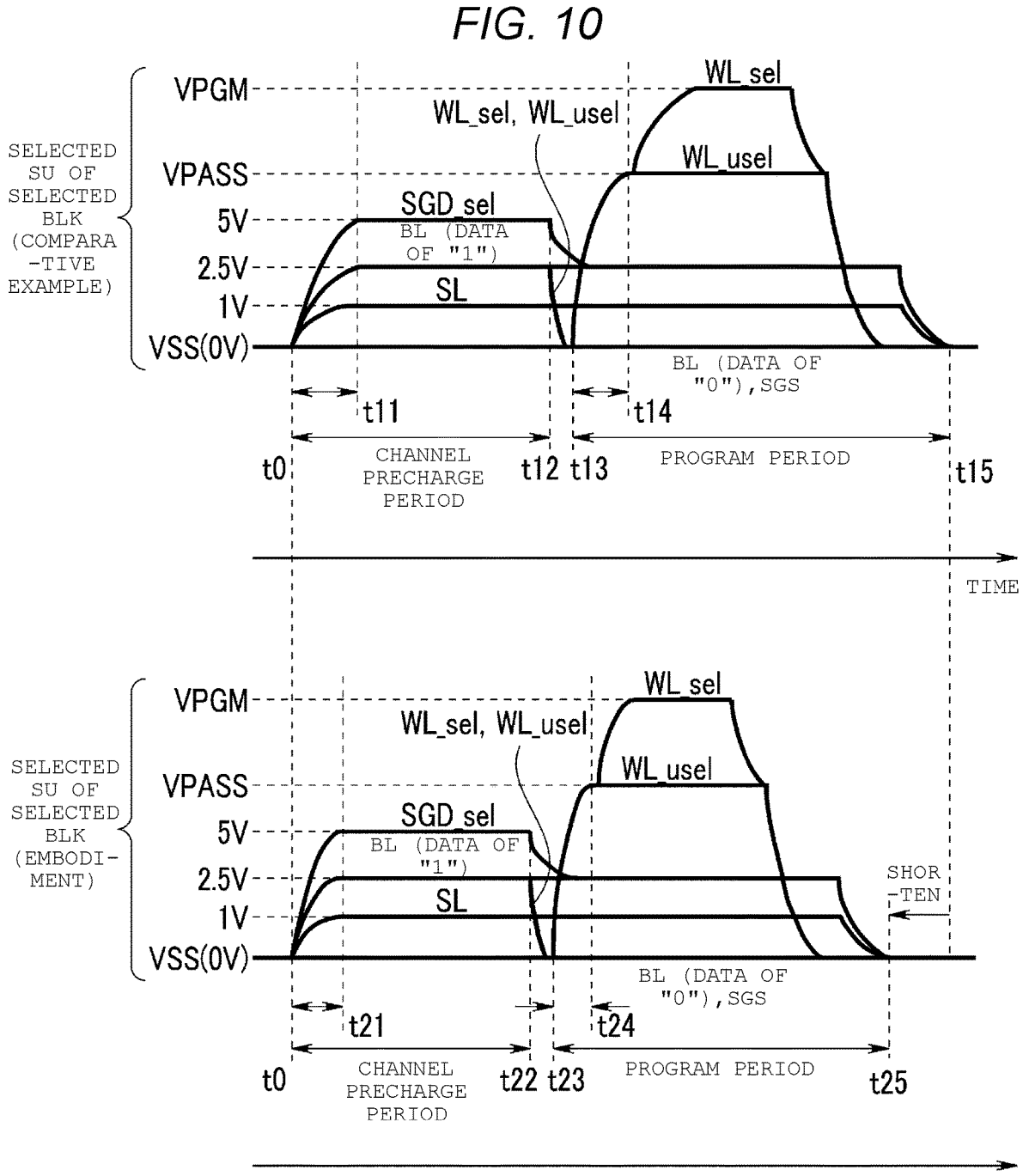
FIG. 10 is a diagram illustrating a voltage change of each wiring in a channel precharge operation and a first program operation.

FIG. 10 is a diagram illustrating a voltage change of each wiring in a channel precharge operation and a first program operation. An upper drawing of FIG. 10 illustrates a voltage change of each wiring according to a comparative example and a lower drawing of FIG. 10 illustrates a voltage change of each wiring according to the present embodiment. Each voltage illustrated in FIG. 10 is generated by the booster circuit 28A in the voltage generation circuit 28 controlled by the sequencer 27.

The program operation is executed in accordance with a program voltage and a bit line voltage applied to a word line and a bit line. In a write target string unit SU (selected SU) of a write target block BLK (selected BLK), a selected gate line SGD (SGD_sel) is set to, for example, 5 V to electrically connect the select gate transistor ST1 before the program voltage VPGM is applied. During the program operation, the selected gate line SGS is in, for example, 0 V. Accordingly, the select gate transistor ST2 enters into an OFF state. Thereafter, when the program voltage VPGM is applied, for example, 2.5 V is set in the selected gate line SGD (SGD-_sel). Thereby, a conductive state and a non-conductive state of the select gate transistor ST1 are determined in accordance with the bit line voltage of the bit line BL connected to the select gate transistor ST1.

In the drawing of FIG. 10 according to the comparative example, a period between time to and time t12 is a period in which a channel precharge operation is executed (hereinafter referred to as a channel precharge period). A period between time t13 and time t15 is a period in which the program voltage VPGM is applied (hereinafter referred to as a program period).

On the other hand, in the drawing of FIG. 10 according to the present embodiment, a period between time to and time t22 is a channel precharge period. A period between time t23 and time t25 is a program period.

The sequencer 27A causes the input voltage Vin input to the charge pump circuit 31 to increase as the voltage Vcc input from the outside increases. Accordingly, since a current supply capability of the charge pump circuit 31 is raised, the sequencer 27A controls a ramp rate to cause a rate of rise of a voltage applied to each wiring to be faster.

By causing the rate of rise of the voltage applied to each wiring to be faster, it is possible to cause rise periods (time t0 to time t21) and (time t23 to time t24) of the voltage applied to each wiring according to the present embodiment to be shorter than rise periods (time t0 to time t11) and (time t13 to time t14) according to the comparative example. By causing the rate of rise of the voltage applied to each wiring to be faster, it is possible to cause the channel precharge period (time t0 to time t22) and the program period (time t23 to time t25) according to the present embodiment to be shorter than the channel precharge period (time t0 to time t12) and the program period (time t13 to time t15) according to the comparative example.

Although not illustrated in FIG. 10, for example, by causing a rise period of the read pass voltage VREAD applied to the non-selected word line in the verification operation to be shorter, it is possible to shorten the verification operation in the present embodiment.

As a result, it is possible to shorten a time taken for the write operation according to the present embodiment than a time taken for the write operation according to the comparative example.

Figure 11:
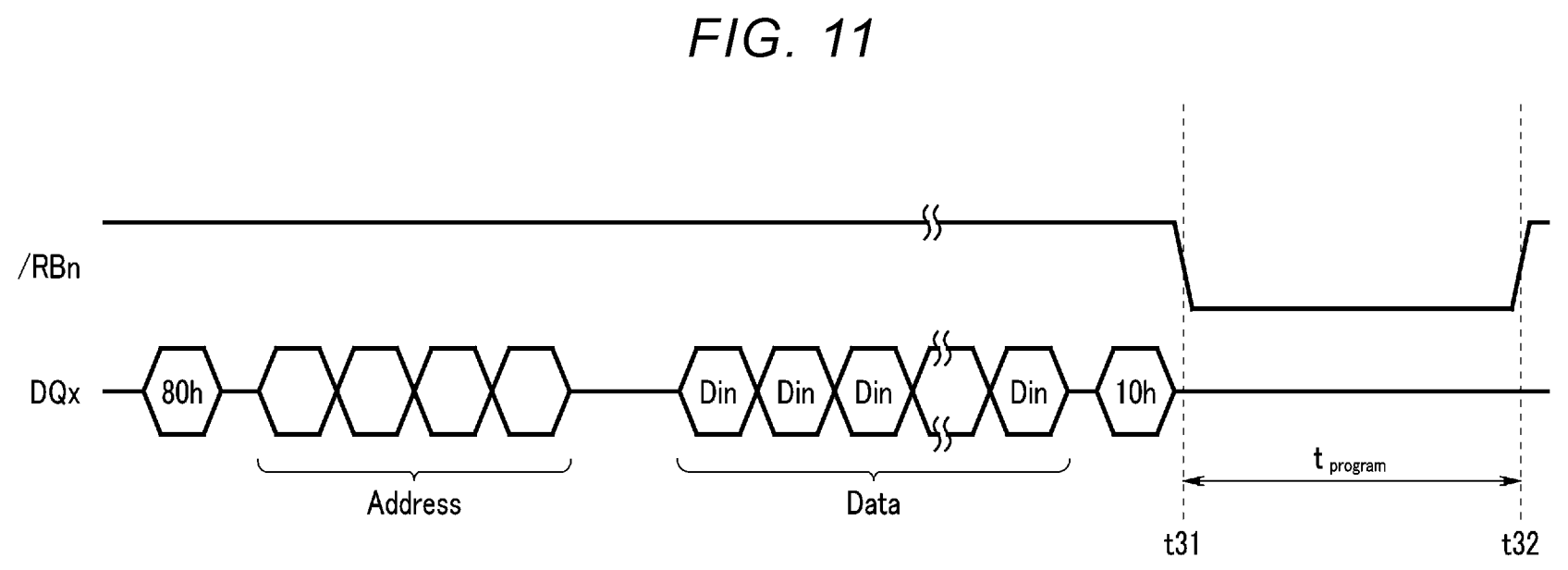

FIG. 11 is a command sequence and a timing chart illustrating a write operation. In FIG. 11, the ready busy signal /RB and a signal DQx (for example, DQ0 to DQ7) are illustrated.

The input/output circuit 22 is controlled by the logical control circuit 21 such that a signal DQ (for example, DQ0 to DQ7) is transmitted to and received from the memory controller 1 via a bus. The signal DQ is received in order of a command (80h), an address, data, and a command (10h). The signal DO is received for a period in which the ready busy signal /RB is at a high level (ready state).

When the ready busy signal /RB enters into a low level (busy state), a write operation for received data is executed. The write operation is executed in units of pages (cell unit CU), and in an example of FIG. 11, data corresponding to one page is written for a low level period of a ready busy signal /RB during a period of times t31 to t32. That is, in the example of FIG. 11, the period of times t31 to t32 is a write time $t_{program}$. In the present embodiment, by causing a rate of rise of a voltage applied to each wiring to be faster, it is possible to shorten the write time $t_{program}$.

The sequencer 27A control the ramp rate for the read voltage VREAD and the erasing voltage VERA such that the rate of rise is faster, and thus it is possible to shorten a time taken for reading and erasing.

Figure 12:
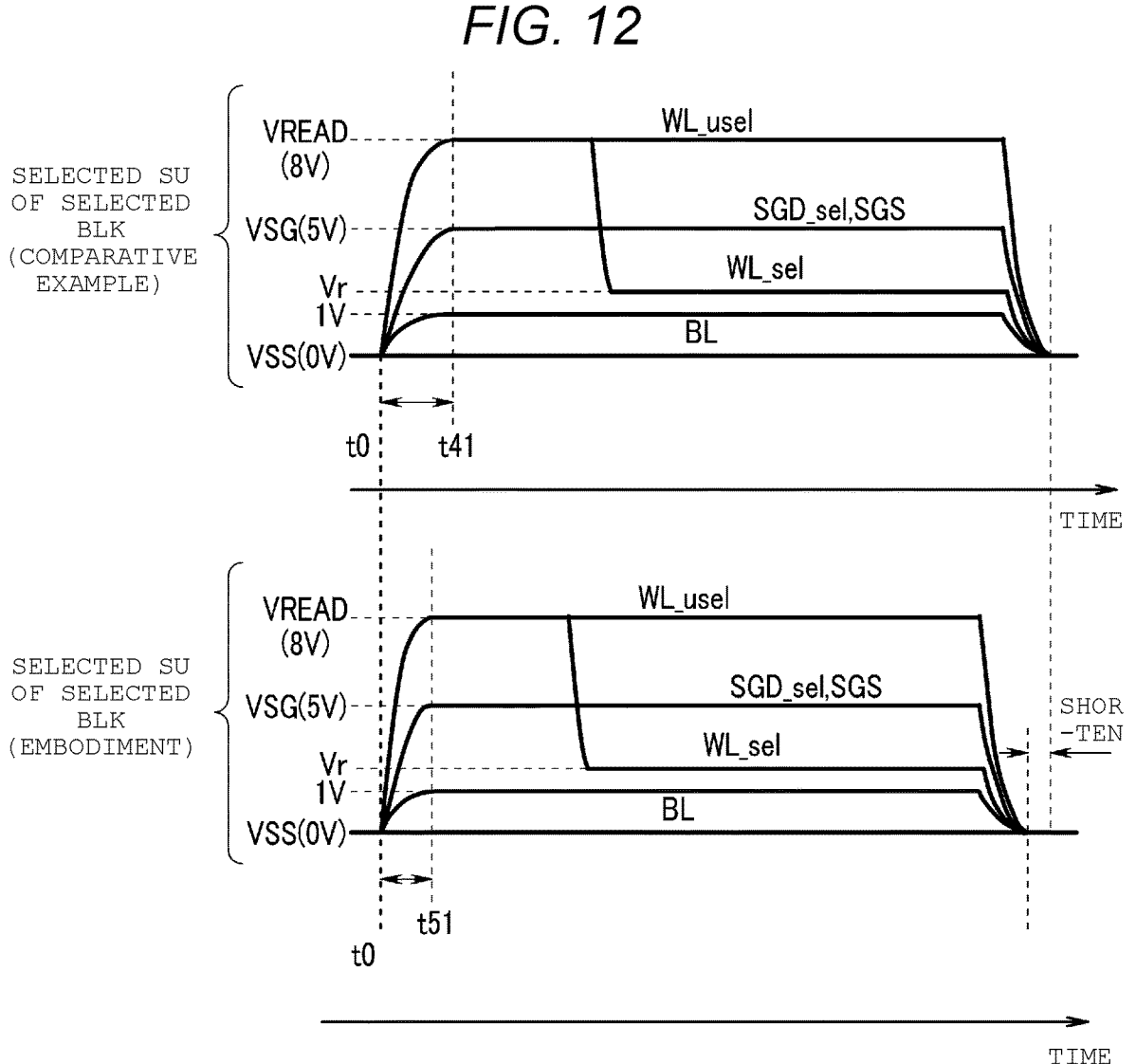
FIG. 12 is a diagram illustrating a voltage change of each wiring in a read operation.

FIG. 12 is a diagram illustrating a voltage change of each wiring in a read operation. An upper drawing of FIG. 12 illustrates a voltage change of each wiring according to a comparative example and a lower drawing of FIG. 12 illustrates a voltage change of each wiring according to the present embodiment. Each voltage illustrated in FIG. 12 is generated by the booster circuit 28A in the voltage generation circuit 28 controlled by the sequencer 27.

The read operation includes a read pass voltage VREAD application period and an actual read period. During the read pass voltage VREAD application period, the row decoder 25 applies a voltage VSG (for example, 5 V) for turning on the select gate transistors ST1 and ST2 to the selected gate lines SGD_sel and SGS of a selected block. The row decoder 25 applies a sufficiently high voltage VREAD (for example, 8 V) necessary to turn on each memory cell transistor to the selected word line WL_sel of the selected block and the non-selected word line WL_usel of the selected block. A voltage VREADK slightly higher than the voltage VREAD may be applied to a word line adjacent to the selected word line WL_sel (adjacent word line) to easily electrically connect the memory cell transistors connected to the adjacent word line.

During the actual read period, the voltage VSG (for example, 5 V) is maintained in the selected gate lines SGD_sel and SGS of a selected string unit of the selected block. During the actual read period, the row decoder 25 applies a read voltage Vr to the selected word line WL_sel of the selected block and applies the voltage VREAD or VREADK to the non-selected word line WL_usel of the selected block.

The sequencer 27A increases the input voltage Vin input to the charge pump circuit 31 as the voltage Vcc input from the outside increases. Accordingly, since a current supply capability of the charge pump circuit 31 is raised, the sequencer 27A controls a ramp rate such that a rate of rise of a voltage applied to each wiring is faster.

By causing the rate of rise of the voltage applied to each wiring to be faster, it is possible to cause a rise period (time t0 to time t51) of a voltage applied to each wiring according to the present embodiment to be shorter than a rise period (time t0 to time t41) according to the comparative example.

Figure 13:
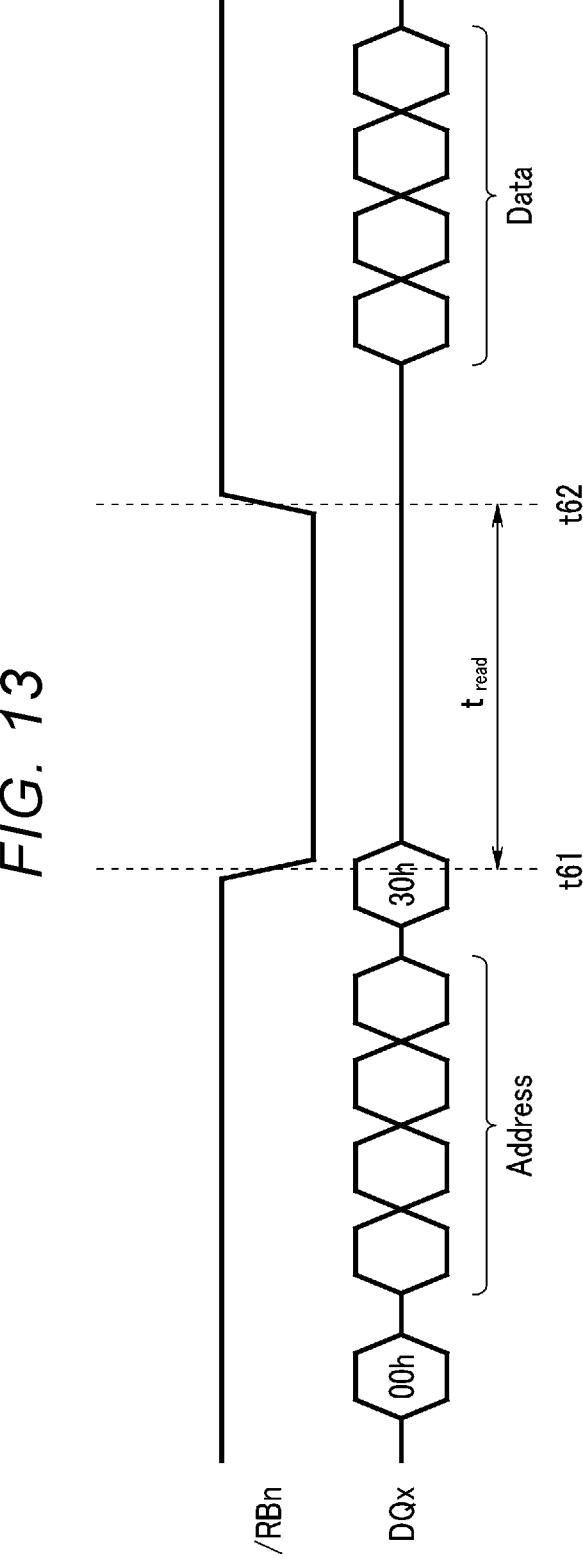
FIG. 13 is a command sequence and a timing chart illustrating the read operation.

FIG. 13 is a command sequence and a timing chart illustrating a read operation. In FIG. 13, the ready busy signal /RB and a signal DQx (for example, DQ0 to DQ7) are illustrated.

The signal DO is received in order of a command (00h), an address, and a command (30h). The signal DQ is received for a period in which the ready busy signal /RB is at a high level (ready state).

When the ready busy signal /RB enters into a low level (busy state), a read operation for data is executed. In the example of FIG. 13, a period of times t61 to t62 is a read time $t_{read}$. In the present embodiment, by causing a rate of rise of a voltage applied to each wiring to be faster, it is possible to shorten the read time $t_{read}$.

Figure 14:
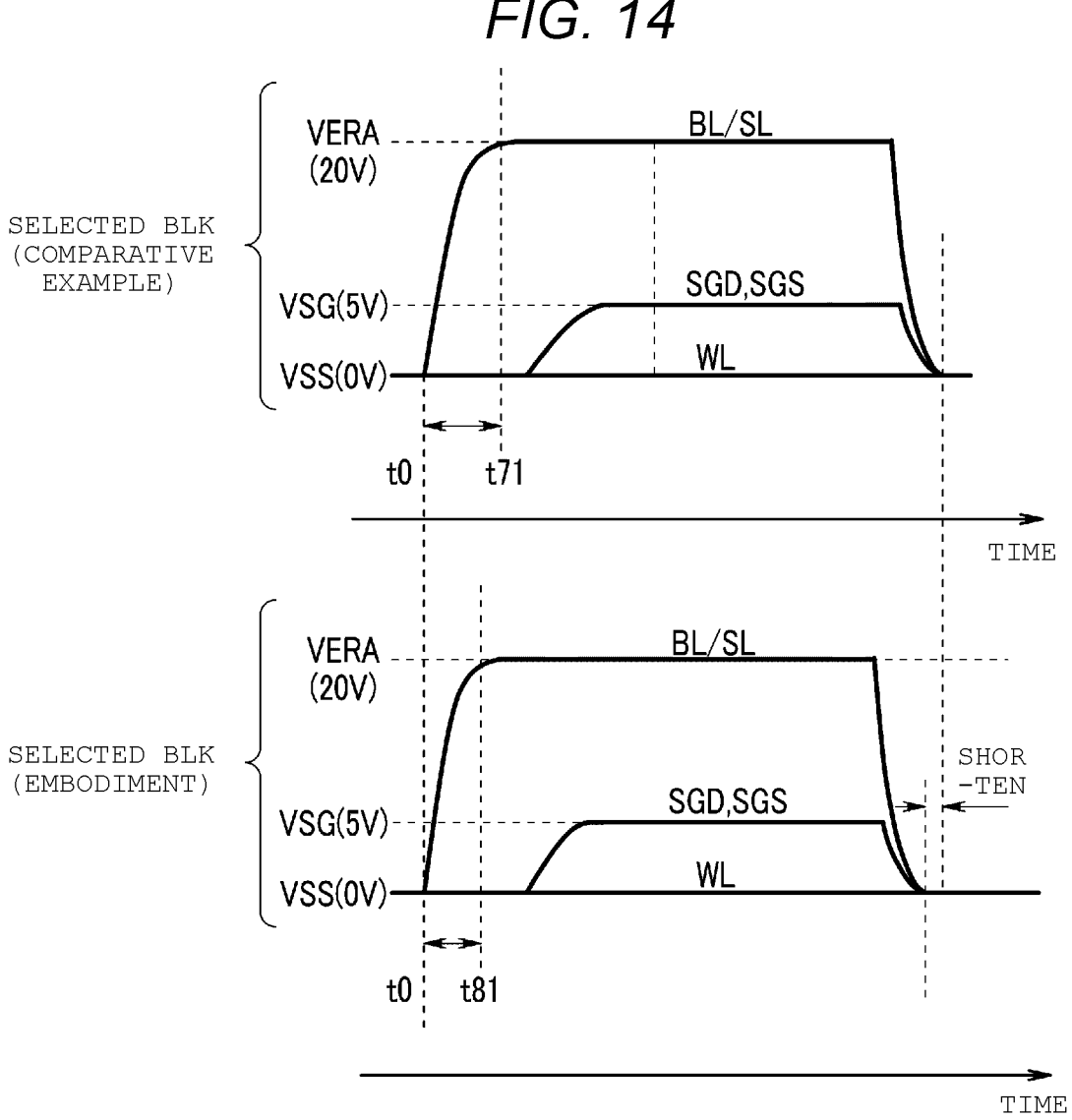
FIG. 14 is a diagram illustrating a voltage change of each wiring in an erasing operation.

FIG. 14 is a diagram illustrating a voltage change of each wiring in an erasing operation. An upper drawing of FIG. 14 illustrates a voltage change of each wiring according to a comparative example and a lower drawing of FIG. 14 illustrates a voltage change of each wiring according to the present embodiment. Each voltage illustrated in FIG. 14 is generated by the booster circuit 28A in the voltage generation circuit 28 controlled by the sequencer 27.

The sense amplifier 24 applies the voltage VERA (for example, 20 V) to the bit line BL provided in the block BLK which is an erasing operation target. The row decoder 25 applies the voltage VSG (for example, 5 V) for turning on the select gate transistors ST1 and ST2 to the selected gate lines SGD and SGS of the selected block. The row decoder 25 applies, for example, a voltage of 0 V to the selected word line WL_sel of the selected block.

The sequencer 27A increases the input voltage Vin input to the charge pump circuit 31 as the voltage Vcc input from the outside increases. Accordingly, since a current supply capability of the charge pump circuit 31 is raised, the sequencer 27A controls a ramp rate such that a rate of rise of a voltage applied to each wiring is faster.

By causing the rate of rise of the voltage applied to each wiring to be faster, it is possible to cause a rise period (time t0 to time t81) of a voltage applied to each wiring according to the present embodiment to be shorter than a rise period (time t0 to time t71) according to the comparative example.

Figure 15:
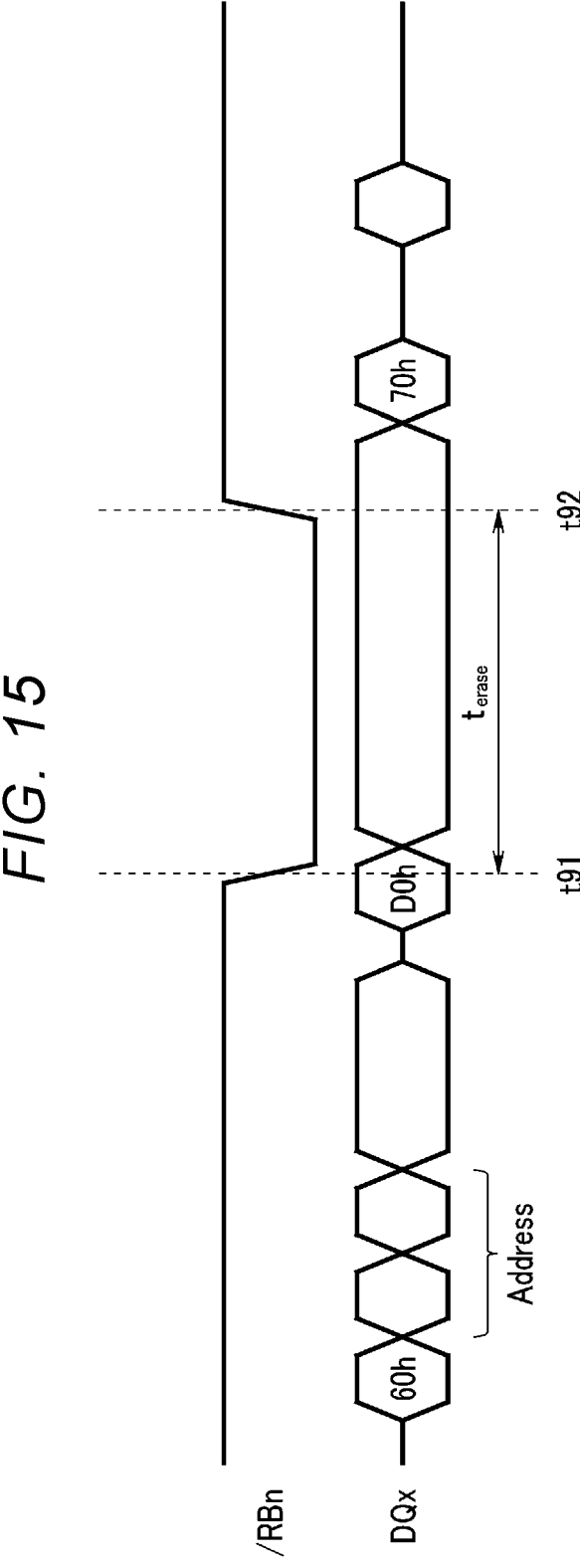
FIG. 15 is a command sequence and a timing chart illustrating the erasing operation.

FIG. 15 is a command sequence and a timing chart illustrating an erasing operation. In FIG. 15, the ready busy signal /RB and a signal DQx (for example, DQ0 to DQ7) are illustrated.

The signal DQ is received in order of a command (60h), an address, and a command (D0h). The signal DO is received for a period in which the ready busy signal /RB is at a high level (ready state).

When the ready busy signal /RB enters into a low level (busy state), an erasing operation is executed. In the example of FIG. 15, a period of times t91 and t92 is an erasing time $t_{erase}$. In the present embodiment, by causing a rate of rise of a voltage applied to each wiring to be faster, it is possible to shorten the erasing time $t_{erase}$.

As described above, the nonvolatile memory 2A controls a ramp rate of voltage boost by the charge pump circuit 31 based on the voltage value information of the voltage Vcc input from the outside. For example, the nonvolatile memory 2A causes rates of rise of the write voltage, the read voltage, and the erasing voltage to be faster by increasing the ramp rate of the voltage boost by the charge pump circuit 31 as the voltage Vcc increases. As a result, according to the present embodiment, it is possible to shorten a time taken for any of the writing, reading, and erasing of the nonvolatile memory 2.

According to the comparative example, even when the voltage value of the voltage Vcc is changed, a time taken for any of writing, reading, and erasing is constant. According to the present embodiment, however, as the voltage value of the voltage Vcc is higher, a time taken for any of writing, reading, and erasing is shortened. That is, a first operation time (a period in which the ready busy signal /RB is busy to correspond to a received command) in the case of an operation of the nonvolatile memory 2 when a voltage input from the outside is the first voltage value is shorter than a second operation time in the case of an operation of the nonvolatile memory 2 when the voltage input from the outside is the second voltage value less than the first voltage value.

In FIGS. 10, 12, and 14 according to the present embodiment, the times of rise of the voltage supplied to the wiring have been compared using the comparative examples and the present embodiment as examples. According to the present embodiment, a similar relation is obtained even when the power voltage Vcc is low and when the power voltage Vcc is high. That is, according to the present embodiment, the rise of the voltage is steeper and the time of rise is shorter when the power voltage Vcc is high than when the power voltage Vcc is low. That is, a time of rise of the wiring to a predetermined voltage when the voltage input from the outside is the first voltage value is shorter than a time of rise of the wiring to the predetermined voltage when the voltage input from the outside is the second voltage value less than the first voltage value.

Third Embodiment

Next, a third embodiment will be described.

Figure 16:
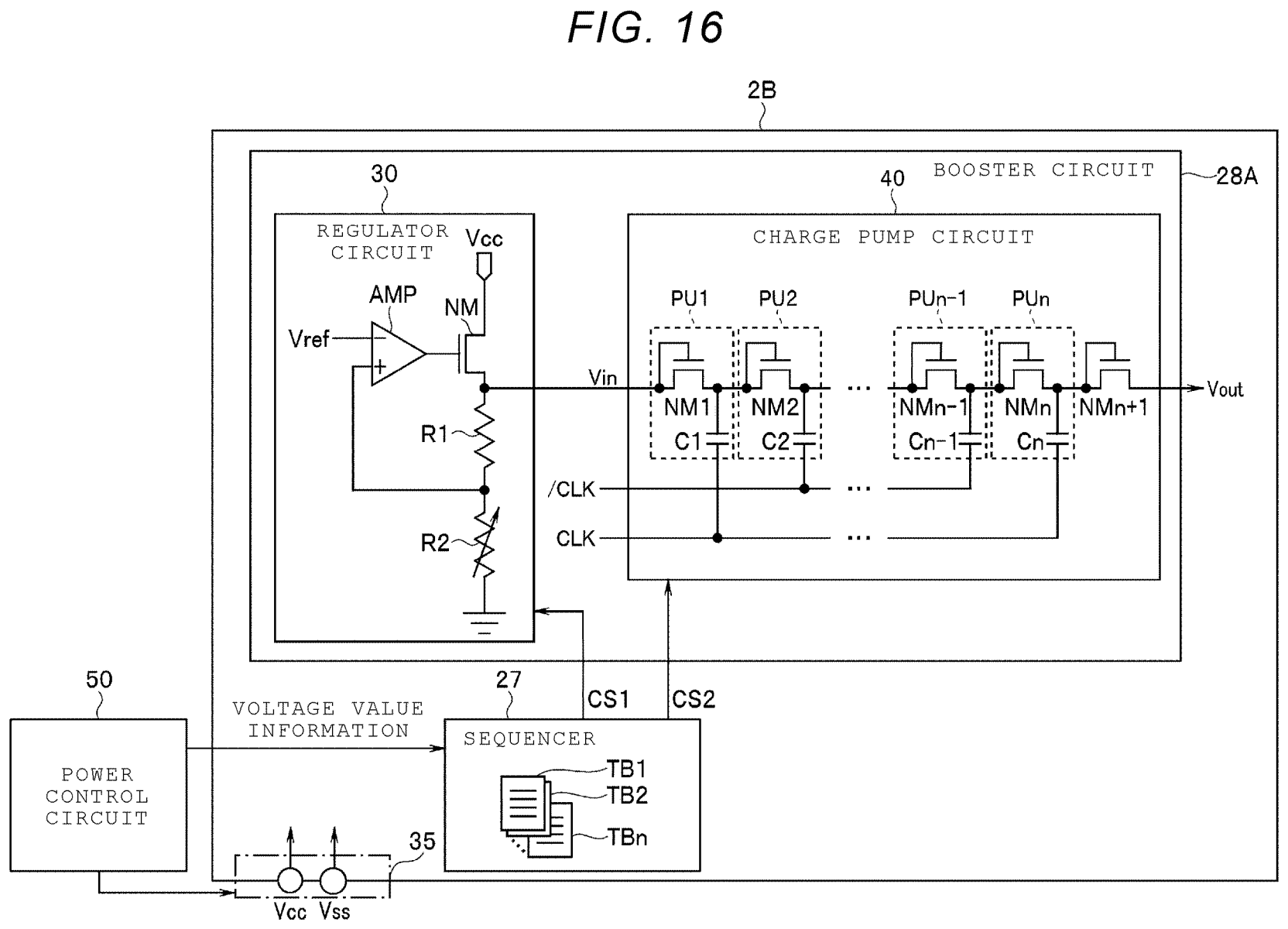

FIG. 16 is a diagram illustrating an example of a configuration of a sequencer and a booster circuit in a nonvolatile memory according to the third embodiment. In FIG. 16, the same reference numerals are given to configurations similar to those of FIG. 4, and description thereof will be omitted.

As illustrated in FIG. 16, in a nonvolatile memory 2B, the voltage monitor circuit 29 is deleted from the nonvolatile memory 2 of FIG. 4. A power control circuit 50 is provided outside of the nonvolatile memory 2. The power control circuit 50 may be contained in the memory controller 1 or may be provided in a separate chip from the memory controller 1.

The power control circuit 50 supplies various types of power such as a power Vcc to the nonvolatile memory 2B. The power control circuit 50 outputs voltage value information of the voltage Vcc to the sequencer 27.

Based on the voltage value information of the voltage Vcc input from the power control circuit 50, the sequencer 27 outputs the control signals CS1 and CS2 to the regulator circuit 30 and the charge pump circuit 31 with reference to the lookup tables TB.

Accordingly, the sequencer 27 changes the input voltage Vin input from the regulator circuit 30 to the charge pump circuit 31 and the number of stages of the charge pump circuit 31 based on the voltage value information of the voltage Vcc input to the nonvolatile memory 2B.

As described above, the sequencer 27 receives the voltage value information of the voltage Vcc from the power control circuit 50 outside of the nonvolatile memory 2 and changes the input voltage Vin input from the regulator circuit 30 to the charge pump circuit 31 and the number of stages of the charge pump circuit 31 based on the voltage value information. As a result, the nonvolatile memory 2B can improve power efficiency of the booster circuit 28A as in the first embodiment.

Modification

Figure 17:
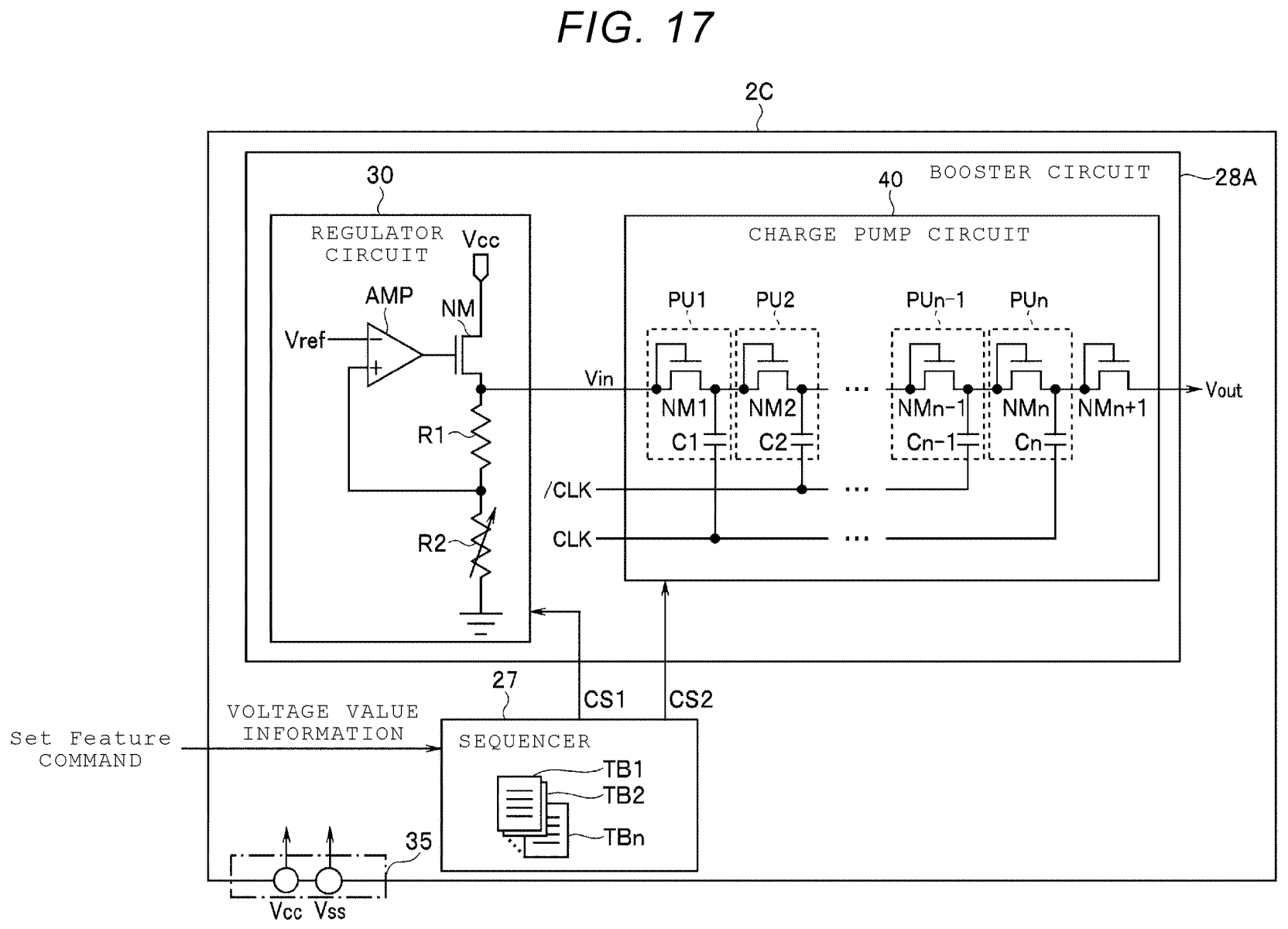

FIG. 17 is a diagram illustrating an example of a configuration of a sequencer and a booster circuit in a nonvolatile memory according to a modification of the third embodiment. In FIG. 17, the same reference numerals are given to configurations similar to those of FIG. 16, and description thereof will be omitted.

In a nonvolatile memory 2C, instead of the power control circuit 50 of FIG. 16, the voltage value information of the voltage Vcc is input to the sequencer 27 with a set feature command.

Figure 18:
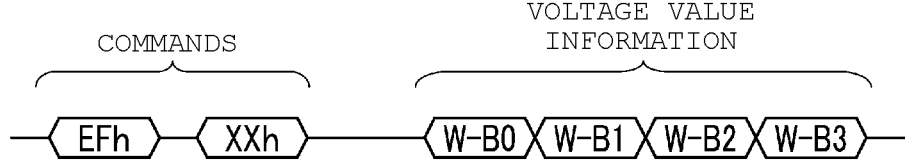
FIG. 18 is a diagram illustrating an example of a command sequence for setting voltage value information.

FIG. 18 is a diagram illustrating an example of a command sequence for setting the voltage value information.

First, the host issues a parameter setting command "EFh" to transmit the parameter setting command "EFh" to the memory controller 1. The parameter setting command "EFh" is a command for commanding the semiconductor memory device to change a parameter. The parameter setting command "EFh" is also called a set feature command.

Subsequently, the host issues a command "XXh" to transmits the command "XXh" to the memory controller 1. The command "XXh" is a command for giving an instruction for the voltage Vcc used in the nonvolatile memory 2.

Subsequently, the host issues voltage value information "W-B0" to "W-B3" over four cycles and transmits the voltage value information to the memory controller 1. The user sets any one voltage Vcc of sixteen voltages from, for example, 2.4 V to 3.9 V in a 0.1 V step using the 4-bit voltage value information "W-B0" to "W-B3". Any number of bits of the voltage value information can be used.

The memory controller 1 transmits the set feature command transmitted from the host as the signals DQ<7:0> to the nonvolatile memory 2. The set feature command transmitted as the signals DQ<7:0> to the nonvolatile memory 2 is input to the sequencer 27 via the input/output circuit 22.

Based on the voltage value information of the voltage Vcc set with the set feature command, the sequencer 27 outputs the control signals CS1 and CS2 to the regulator circuit 30 and the charge pump circuit 31 with reference to the lookup table TB.

As described above, the sequencer 27 receives the set feature command from the outside of the nonvolatile memory 2 and changes the input voltage Vin input from the regulator circuit 30 to the charge pump circuit 31 and the number of stages of the charge pump circuit 31 based on the voltage value information set with the set feature command. As a result, the nonvolatile memory 2C can improve power efficiency of the booster circuit 28A as in the first embodiment.

In the third embodiment and the modification, the configuration of the second embodiment may be applied. Based on the voltage value information from the power control circuit 50 or the voltage value information set with the set feature command, the sequencer 27 may output the control signal CS3 for controlling a ramp rate to the charge pump circuit 31 and control the ramp rate of a voltage generated by the charge pump circuit 31.

Fourth Embodiment

Next, a fourth embodiment will be described.

The nonvolatile memory 2 according to each of the above-described embodiments changes the input voltage Vin input from the regulator circuit 30 to the charge pump circuit 31 and the number of stages of the charge pump circuit 31 based on the voltage value information of the voltage Vcc input from the outside of the nonvolatile memory 2.

On the other hand, based on temperature information of a chip (or a package) of the nonvolatile memory 2, a nonvolatile memory 2D according to the fourth embodiment changes the input voltage Vin input from the regulator circuit 30 to the charge pump circuit 31 and the number of stages of the charge pump circuit 31. This is because, since the charge pump circuit 31 is configured with an MOS transistor, an output current changes depending on a temperature although not as much as the input voltage value. In general, the higher the temperature is, the lower an output voltage of the charge pump circuit 31 is.

Figure 19:
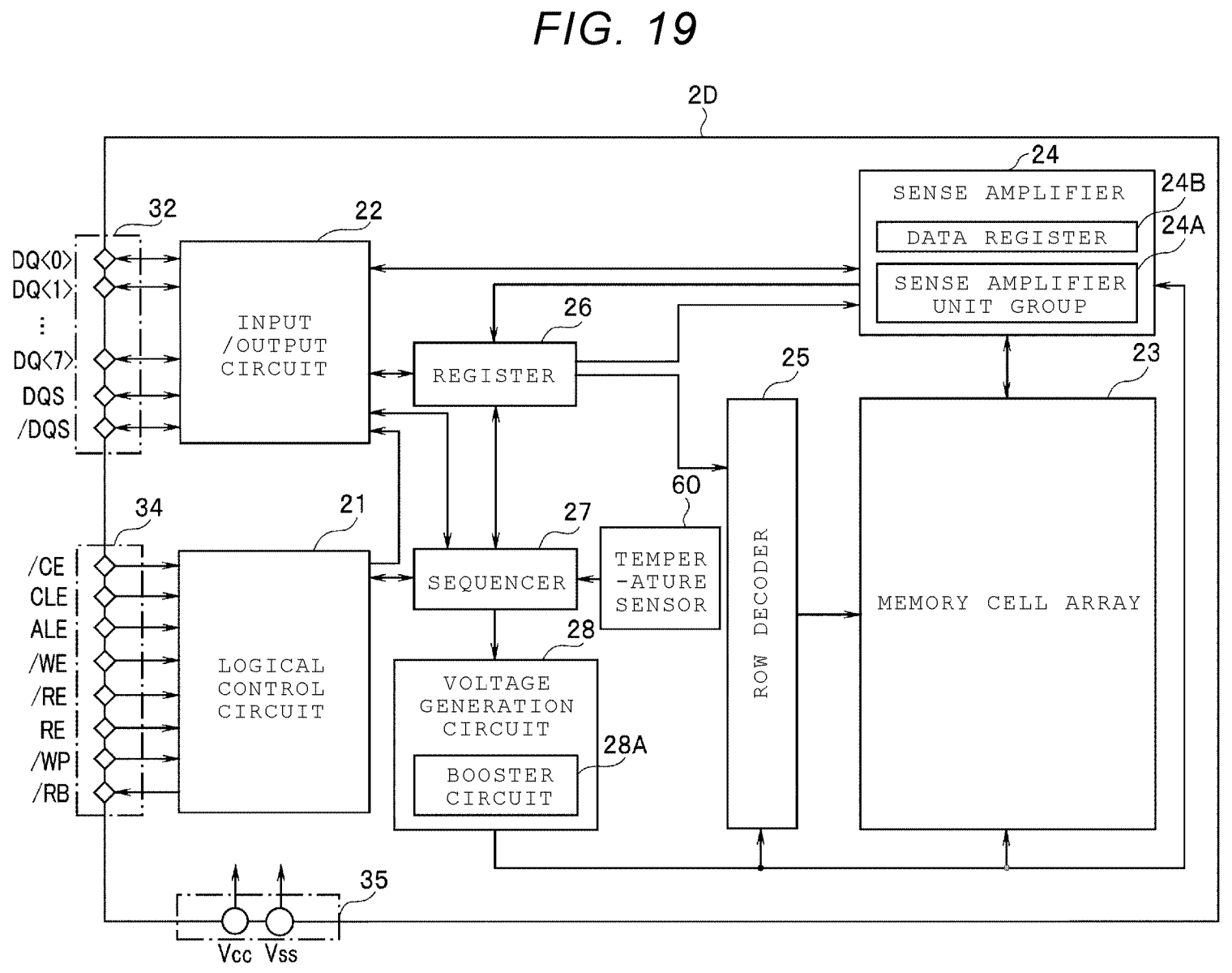

FIG. 19 is a block diagram illustrating a configuration example of a nonvolatile memory according to the fourth embodiment. In FIG. 19, the same reference numerals are given to configurations similar to those of FIG. 2, and description thereof will be omitted.

As illustrated in FIG. 19, in the nonvolatile memory 2D, the voltage monitor circuit 29 is removed from the nonvolatile memory 2 of FIG. 2 and a temperature sensor 60 is added.

The 60 measures a temperature sensor temperature of the chip (or a package) of the nonvolatile memory 2D. The temperature sensor 60 measures the temperature of the chip of the nonvolatile memory 2D in, for example, a 5° C. step, a 10° C. step, or a 20° C. step. The temperature sensor 60 outputs information regarding the measured temperature (hereinafter referred to as temperature information) to the sequencer 27. The temperature sensor 60 may be provided in the sequencer 27.

Based on the input temperature information, the sequencer 27 generates various digital signals such as about eight to thirty two types (3 to 5 bits) codes CD, for example, with reference to the plurality of lookup tables TB. The sequencer 27 outputs the generated various digital signals to the regulator circuit 30 and the charge pump circuit 31 in the same manner as the control signals CS1 and CS2.

The regulator circuit 30 changes the input voltage Vin supplied to the charge pump circuit 31 in accordance with the digital signals from the sequencer 27. The charge pump circuit 31 changes the number of stages in accordance with the digital signals from the sequencer 27. As a result, the nonvolatile memory 2D can improve power efficiency of the booster circuit 28A.

The digital signals may be directly transmitted from the temperature sensor 60 to the regulator circuit 30 and the charge pump circuit 31.

The lookup table TB may be a table in which the voltage value information of the voltage Vcc and the temperature information multiplied. That is, in accordance with the voltage value information from the voltage monitor circuit 29 of FIG. 2 and the temperature information from the temperature sensor 60 of FIG. 19, the sequencer 27 may change the input voltage Vin input from the regulator circuit 30 to the charge pump circuit 31 and the number of stages of the charge pump circuit 31.

In each of the above-described embodiments, the booster circuit 28A of the voltage generation circuit 28 has been described as an example, but the configuration according to each of the above-described embodiments can also be applied to another booster circuit in the nonvolatile memory 2. For example, a booster circuit in the sense amplifier 24 has the same configuration as the booster circuit 28A of the voltage generation circuit 28, and the sequencer 27 outputs the control signals CS1 and CS2 in accordance with the voltage Vcc to the booster circuit in the sense amplifier 24. Accordingly, performance of the charge pump circuit in the sense amplifier 24 can be improved, and thus performance of the entire nonvolatile memory 2 can be improved.

In each of the above-described embodiments, the NAND flash memory has been exemplified as a nonvolatile memory, but the above-described embodiments are not limited to the NAND flash memory and can also be applied to another nonvolatile memory.

Hereinafter, a NOR flash memory will be described as an example of a nonvolatile memory to which each of the above-described embodiments can be applied.

Figure 20:
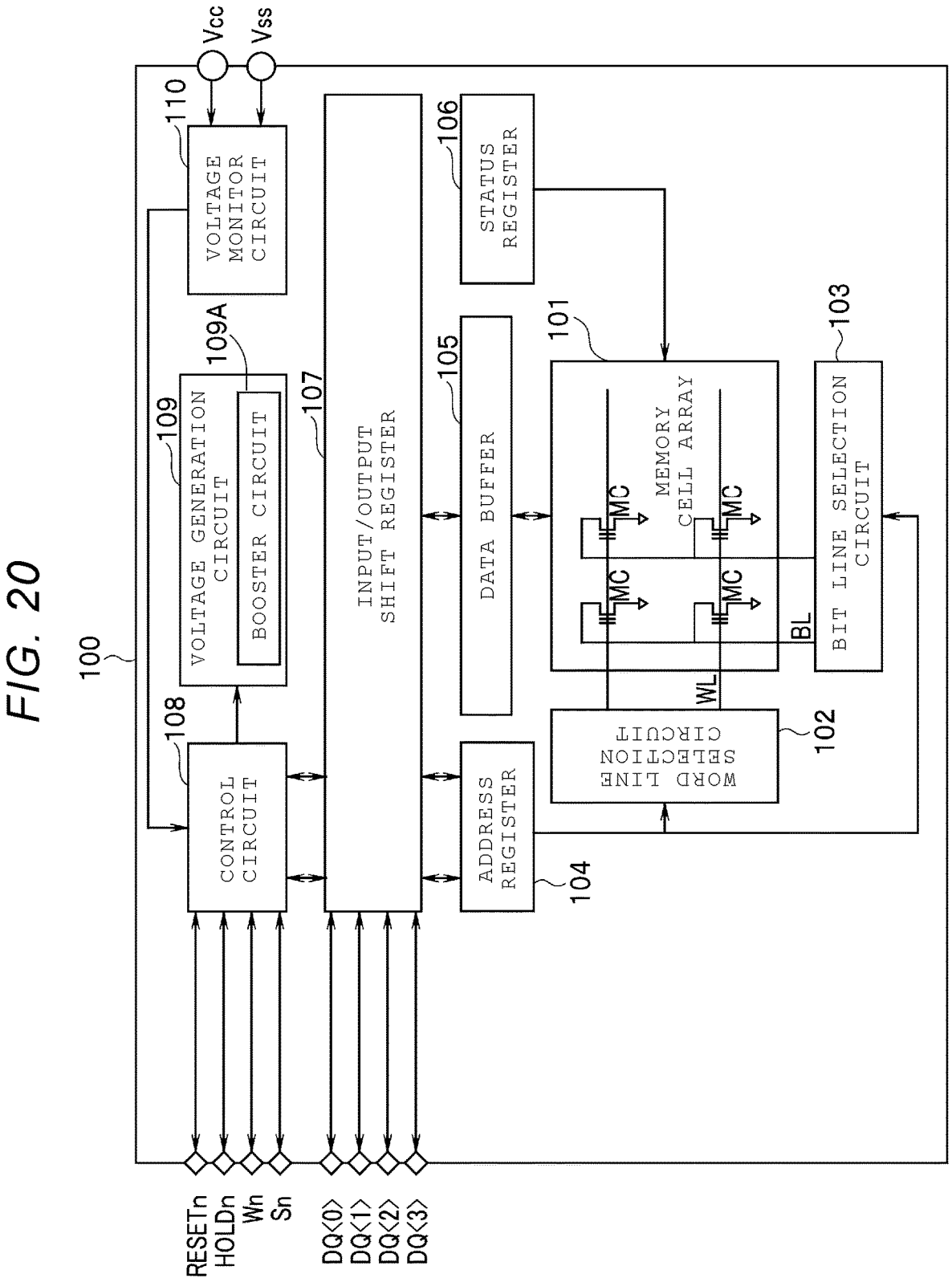
FIG. 20 is a block diagram illustrating an example of a configuration of an NOR flash memory.

FIG. 20 is a block diagram illustrating an example of a configuration of an NOR flash memory. A NOR flash memory 100 includes a memory cell array 101 including a plurality of memory cells MC, a word line selection circuit 102 that selects a word line WL, a bit line selection circuit 103 that selects a bit line BL, an address register 104, a data buffer 105, a status register 106, an input/output shift register 107, a control circuit 108, a voltage generation circuit 109, and a voltage monitor circuit 110.

The voltage generation circuit 109 includes a booster circuit 109A. A configuration of the booster circuit 109A is the same as the configuration of the booster circuit 28A according to each of the above-described embodiments. The booster circuit 109A includes the regulator circuit 30 and the charge pump circuit 31.

The voltage monitor circuit 110 monitors the voltage value of the voltage Vcc and outputs the voltage value information of the voltage Vcc to the control circuit 108. Based on the voltage value information from the voltage monitor circuit 110, the control circuit 108 changes the input voltage Vin input from the regulator circuit 30 to the charge pump circuit 31 and the number of stages of the charge pump circuit 31. Accordingly, the control circuit 108 can improve power efficiency of the booster circuit 109A in accordance with the voltage Vcc input to the NOR flash memory 100.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a regulator circuit configured to regulate a voltage input from outside and output a regulated voltage;
   a charge pump circuit configured to receive the regulated voltage as an input voltage, boost the input voltage, and output a boosted voltage; and
   a control circuit configured to cause the regulator circuit to vary a voltage level of the regulated voltage based on voltage value information about the voltage input from the outside.

2. The semiconductor device according to claim 1, further comprising:
   a memory cell array, wherein
   the charge pump circuit is configured to output the boosted voltage to the memory cell array.

3. The semiconductor device according to claim 1, wherein
   the regulator circuit includes a variable resistor, and
   the control circuit is configured to cause a resistance value of the variable resistor to be varied in accordance with the voltage value information, to cause the regulator circuit to vary the voltage level of the regulated voltage.

4. The semiconductor device according to claim 1, wherein the charge pump circuit includes a plurality of charge pump units, and the control circuit changes a number of steps of voltage boost by the charge pump units based on the voltage value information.

5. The semiconductor device according to claim 4, wherein when the voltage input from the outside is a first voltage, the number of steps of voltage boost is a first value, and when the voltage input from the outside is a second voltage higher than the first voltage, the number of steps of voltage boost is a second value smaller than the first value.

6. The semiconductor device according to claim 4, wherein the control circuit is configured to output a first digital signal that instructs the voltage level of the regulated voltage to the regulator circuit and a second digital signal that instructs the number of steps of voltage boost by the charge pump units to the charge pump circuit.

7. The semiconductor device according to claim 1, wherein the control circuit changes a ramp rate of voltage boost by the charge pump circuit based on the voltage value information.

8. The semiconductor device according to claim 7, wherein when the voltage input from the outside is a first voltage, the ramp rate is a first ramp rate, and when the voltage input from the outside is a second voltage higher than the first voltage, the ramp rate is a second ramp rate higher than the first ramp rate.

9. The semiconductor device according to claim 1, further comprising:

a voltage monitor circuit configured to measure the voltage level of the voltage input from the outside and output the measured voltage level as the voltage value information to the control circuit.

10. The semiconductor device according to claim 1, wherein the control circuit receives the voltage value information from an external power control circuit, which is external to the semiconductor device.

11. The semiconductor device according to claim 1, further comprising:

a first terminal that is connectable to a memory controller and through which a command is received, wherein the voltage value information is included in the command received through the first terminal.

12. The semiconductor device according to claim 1, further comprising:

a temperature sensor, wherein the control circuit is configured to cause the regulator circuit to vary the voltage level of the regulated voltage based on a temperature measured by the temperature sensor.

13. The semiconductor device according to claim 1, wherein when the voltage input from the outside is a first voltage, the regulated voltage is at a first voltage level, and when the voltage input from the outside is a second voltage higher than the first voltage, the regulated voltage is at a second voltage level higher than the first voltage level.

14. The semiconductor device according to claim 1, wherein the voltage input from the outside is received at a second terminal, when the voltage input from the outside is a first voltage, an operation current that flows through the second terminal during a predetermined operation is a first current value, and when the voltage input from the outside is a second voltage higher than the first voltage, the operation current that flows through the second terminal during the predetermined operation is a second current value smaller than the first current value.

15. A semiconductor device comprising:

a terminal that receives a voltage input from outside;

a regulator circuit configured to regulate the voltage input from outside and output a regulated voltage; and a charge pump circuit configured to receive the regulated voltage as an input voltage, boost the input voltage, and output a boosted voltage, wherein when the voltage input from the outside is a first voltage, an operation current that flows through the terminal during a predetermined operation is a first current value, and when the voltage input from the outside is a second voltage higher than the first voltage, the operation current that flows through the terminal during the predetermined operation is a second current value smaller than the first current value.

16. The semiconductor device according to claim 15, further comprising:

a memory cell array, wherein the charge pump circuit is configured to output the boosted voltage to the memory cell array, and the predetermined operation is with respect to the memory cell array, and a read pass voltage application operation in a read operation.

17. The semiconductor device according to claim 15, further comprising:

a memory cell array, wherein the charge pump circuit is configured to output the boosted voltage to the memory cell array, and the predetermined operation is with respect to the memory cell array, and a program operation in a write operation.

18. The semiconductor device according to claim 15, further comprising:

a memory cell array, wherein the charge pump circuit is configured to output the boosted voltage to the memory cell array, and the predetermined operation is with respect to the memory cell array, and a verification operation in a write operation.

19. A semiconductor device comprising:

a first terminal that receives a command from a device external to the semiconductor device;

a second terminal through which a ready busy signal is output to the device external to the semiconductor device;

a regulator circuit configured to regulate a voltage input from outside and output a regulated voltage; and a charge pump circuit configured to receive the regulated voltage as an input voltage, boost the input voltage, and output a boosted voltage, wherein when the voltage input from the outside is a first voltage, the ready busy signal stays at a busy state for a first period of time in response to a predetermined command received by the first terminal, and when the voltage input from the outside is a second voltage higher than the first voltage, the ready busy signal stays at the busy state for a second period of time shorter than the first period of time in response to the predetermined command received by the first terminal.

20. The semiconductor device according to claim 19, further comprising:

a memory cell array, wherein the charge pump circuit is configured to output the boosted voltage to the memory cell array, and the predetermined command is a command to execute a write operation.

21. The semiconductor device according to claim 19, further comprising:

a memory cell array, wherein the charge pump circuit is configured to output the boosted voltage to the memory cell array, and the predetermined command is a command to execute a read operation.

* * * * *